(12) United States Patent
Nikolsky

(10) Patent No.: US 8,111,901 B2
(45) Date of Patent: Feb. 7, 2012

(54) APPARATUS AND METHOD FOR SEPARATING A CIRCUIT PATTERN INTO MULTIPLE CIRCUIT PATTERNS

(75) Inventor: Peter Nikolsky, Veldhoven (NL)

(73) Assignee: ASML Masktools B.V., Veldhoven (NL)

( * ) Notice: Subject to any disclaimer, the term of this patent is extended or adjusted under 35 U.S.C. 154(b) by 1180 days.

(21) Appl. No.: 11/889,573

(22) Filed: Aug. 14, 2007

(65) Prior Publication Data
US 2008/0037861 A1 Feb. 14, 2008

Related U.S. Application Data

(60) Provisional application No. 60/837,325, filed on Aug. 14, 2006.

(51) Int. Cl.
*G06K 9/00* (2006.01)
(52) U.S. Cl. .......................................... 382/147; 716/51
(58) Field of Classification Search .................. 382/141, 382/147
See application file for complete search history.

(56) References Cited

U.S. PATENT DOCUMENTS

| | | | |
|---|---|---|---|
| 5,538,815 A | 7/1996 | Oi et al. | |
| 5,867,401 A | 2/1999 | Haruki et al. | |
| 6,066,180 A | 5/2000 | Kim et al. | |
| 6,391,501 B1 | 5/2002 | Ohnuma | |
| 6,763,514 B2 * | 7/2004 | Zhang | 716/53 |
| 7,057,709 B2 | 6/2006 | Rosenbluth | |
| 7,096,127 B2 * | 8/2006 | Ziger et al. | 702/32 |
| 7,587,704 B2 * | 9/2009 | Ye et al. | 716/51 |
| 7,799,487 B2 * | 9/2010 | Hamouda | 430/5 |
| 2003/0174877 A1 * | 9/2003 | Aiger | 382/145 |

FOREIGN PATENT DOCUMENTS

| | | |
|---|---|---|
| JP | 07013326 | 1/1995 |
| JP | 09251204 | 9/1997 |
| JP | 10254120 | 9/1998 |
| JP | 11-184064 | 7/1999 |
| JP | 2002182366 | 6/2002 |
| JP | 2004-153032 | 5/2004 |
| JP | 2005150494 | 6/2005 |
| JP | 2005167253 | 6/2005 |
| WO | WO 2005/048327 | 5/2005 |

* cited by examiner

*Primary Examiner* — Tom Y Lu
(74) *Attorney, Agent, or Firm* — Pillsbury Winthrop Shaw Pittman LLP

(57) ABSTRACT

A method for separating an original circuit pattern to be printed on a wafer, into multiple circuit patterns is disclosed. Simulation to obtain an image log-slope (ILS), normalized image log-slope (NILS), or any other characteristic of an image quality on edges of polygons in the circuit pattern obtained from circuit pattern data is performed. Properly printed edges and not-properly printed edges are identified according to a criterion of an ILS level. The original circuit pattern is separated into multiple circuit patterns such that each of the multiple patterns does not have any not-properly printed edges.

22 Claims, 30 Drawing Sheets

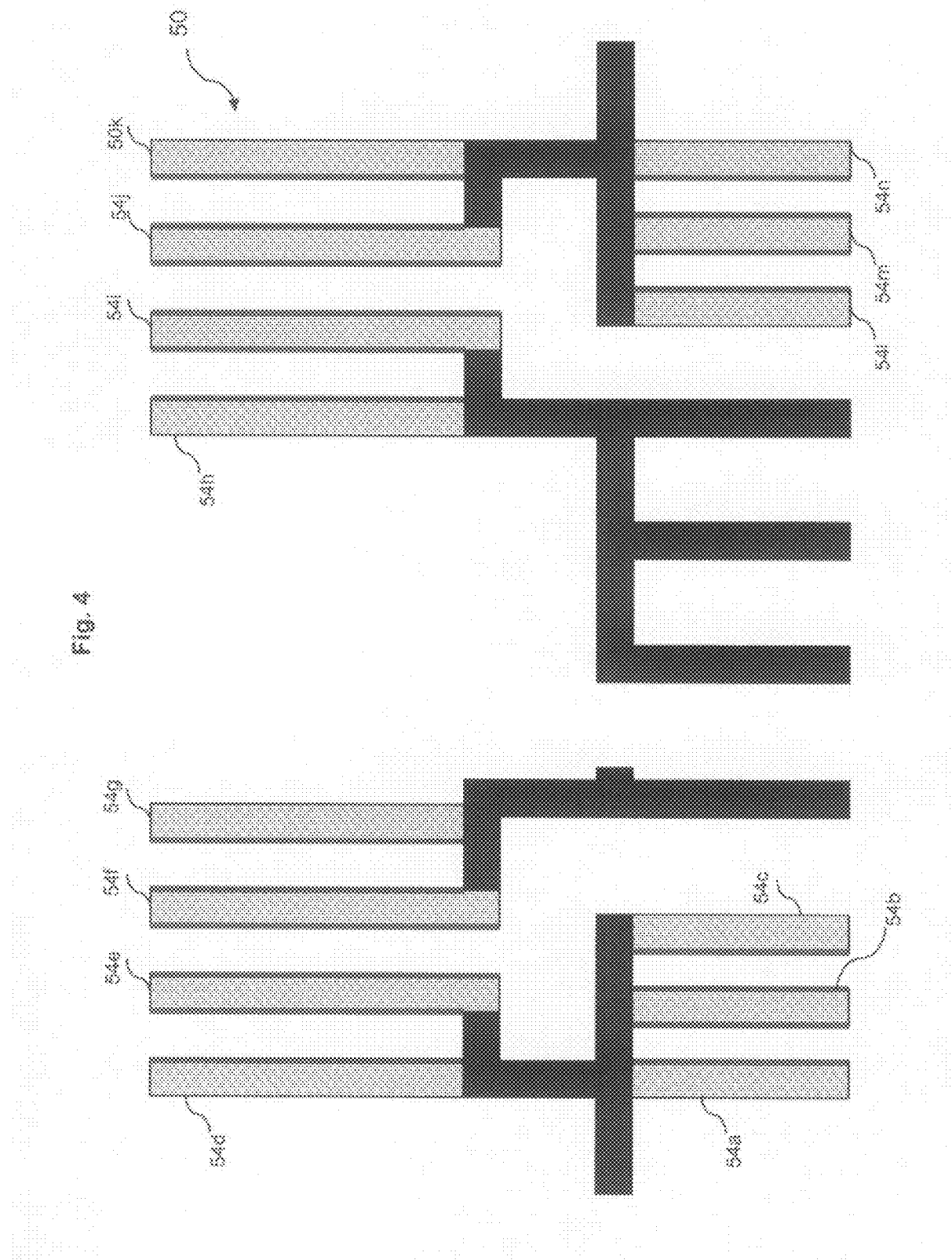

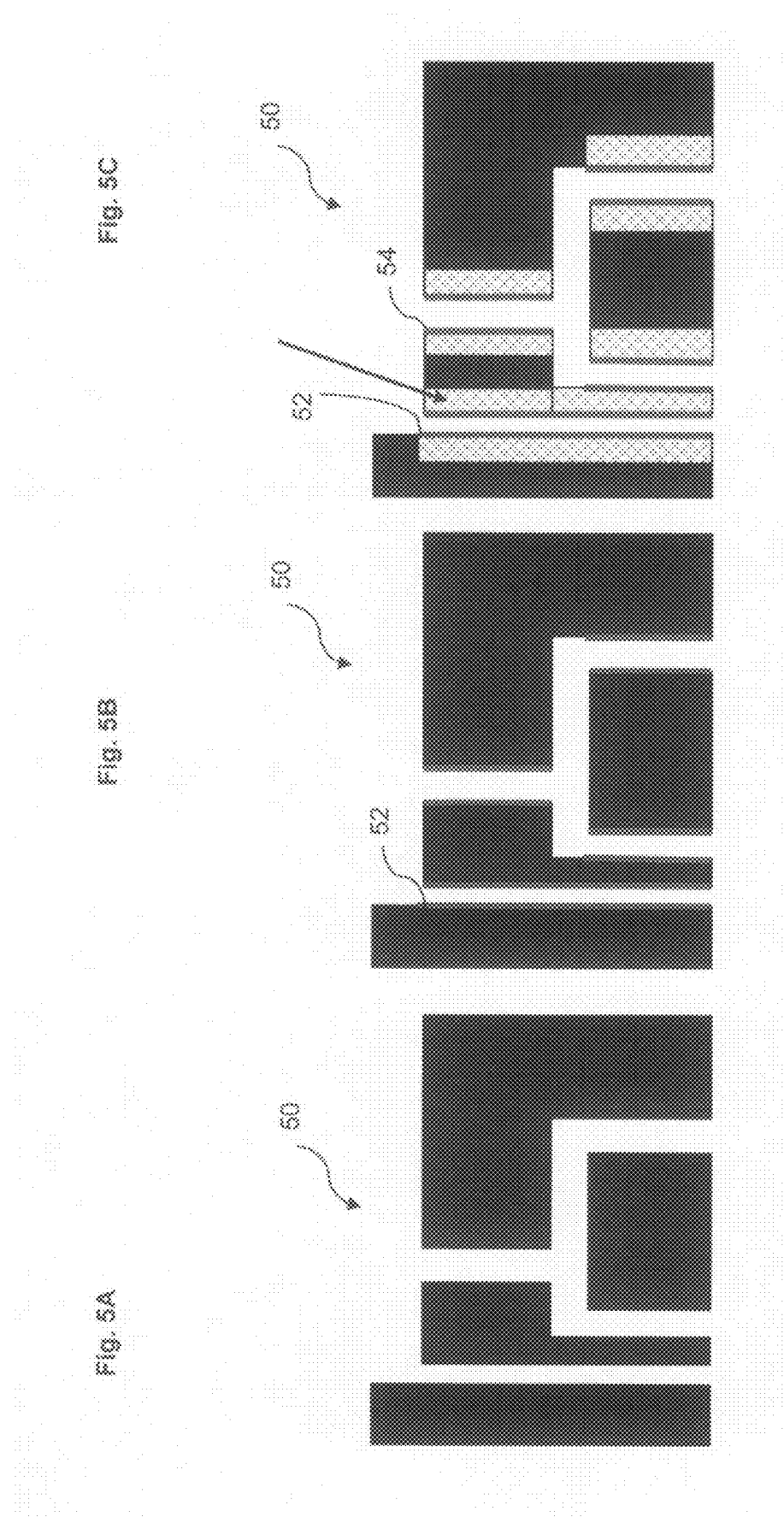

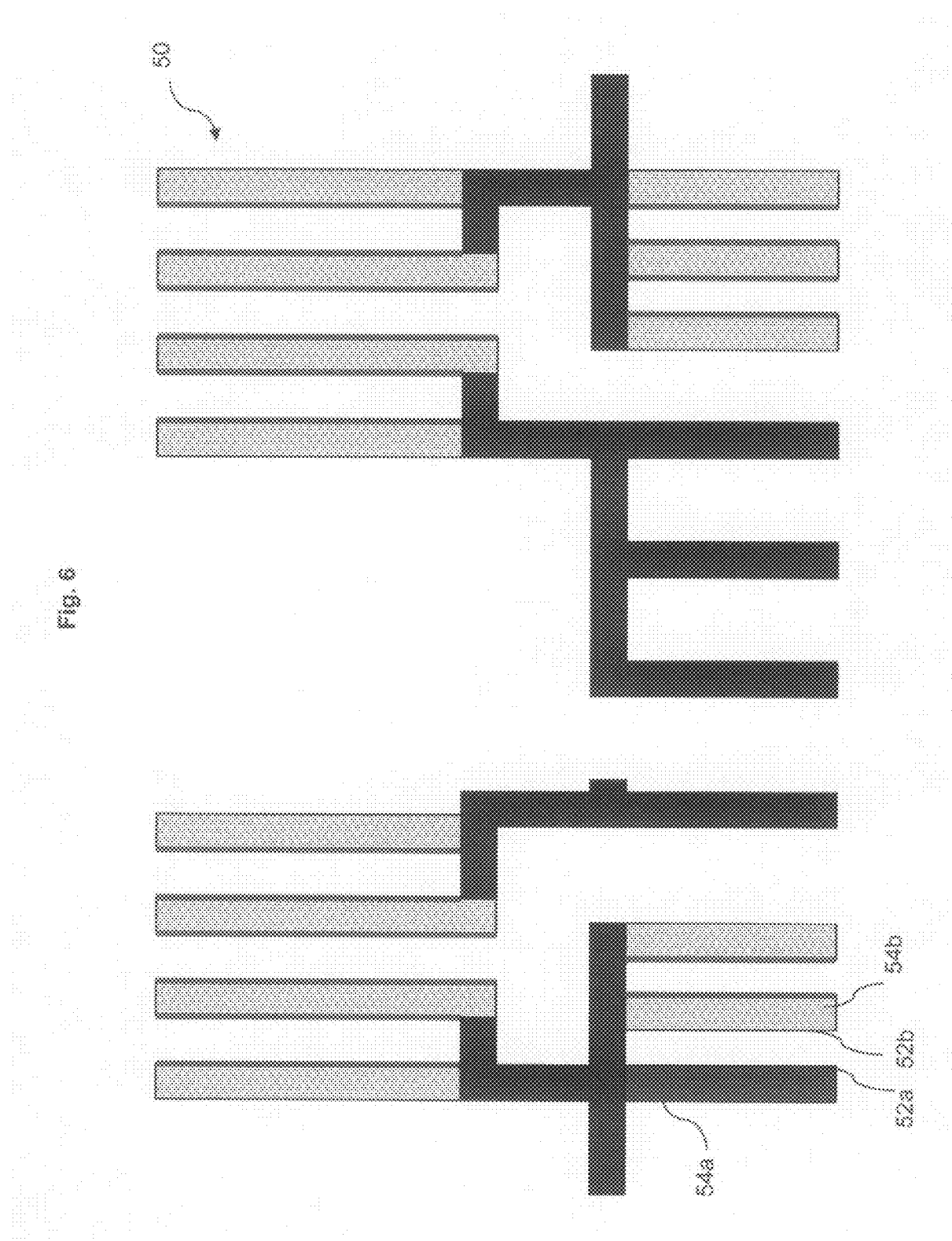

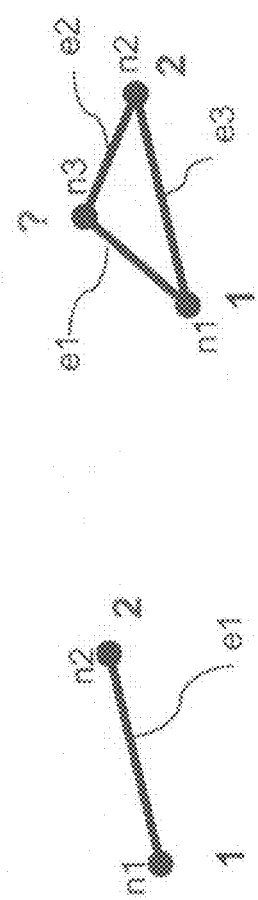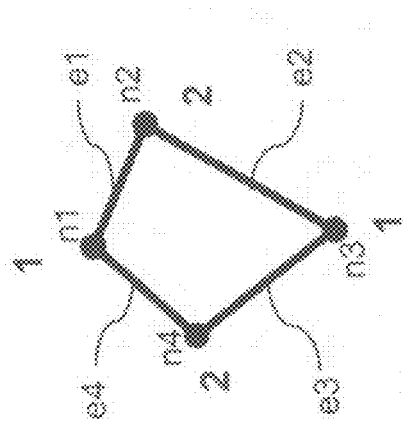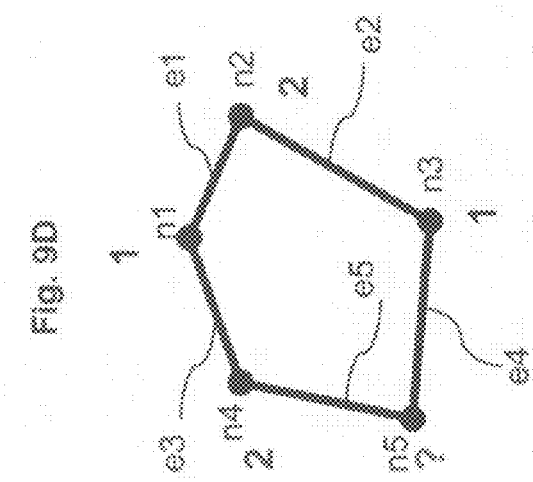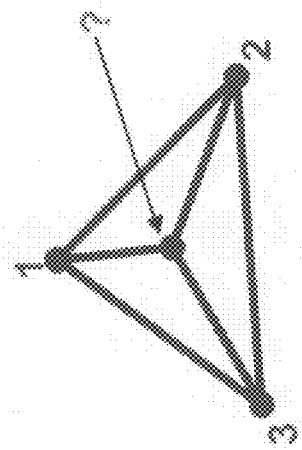
Fig. 9A  Fig. 9B  Fig. 9C  Fig. 9D  Fig. 9E

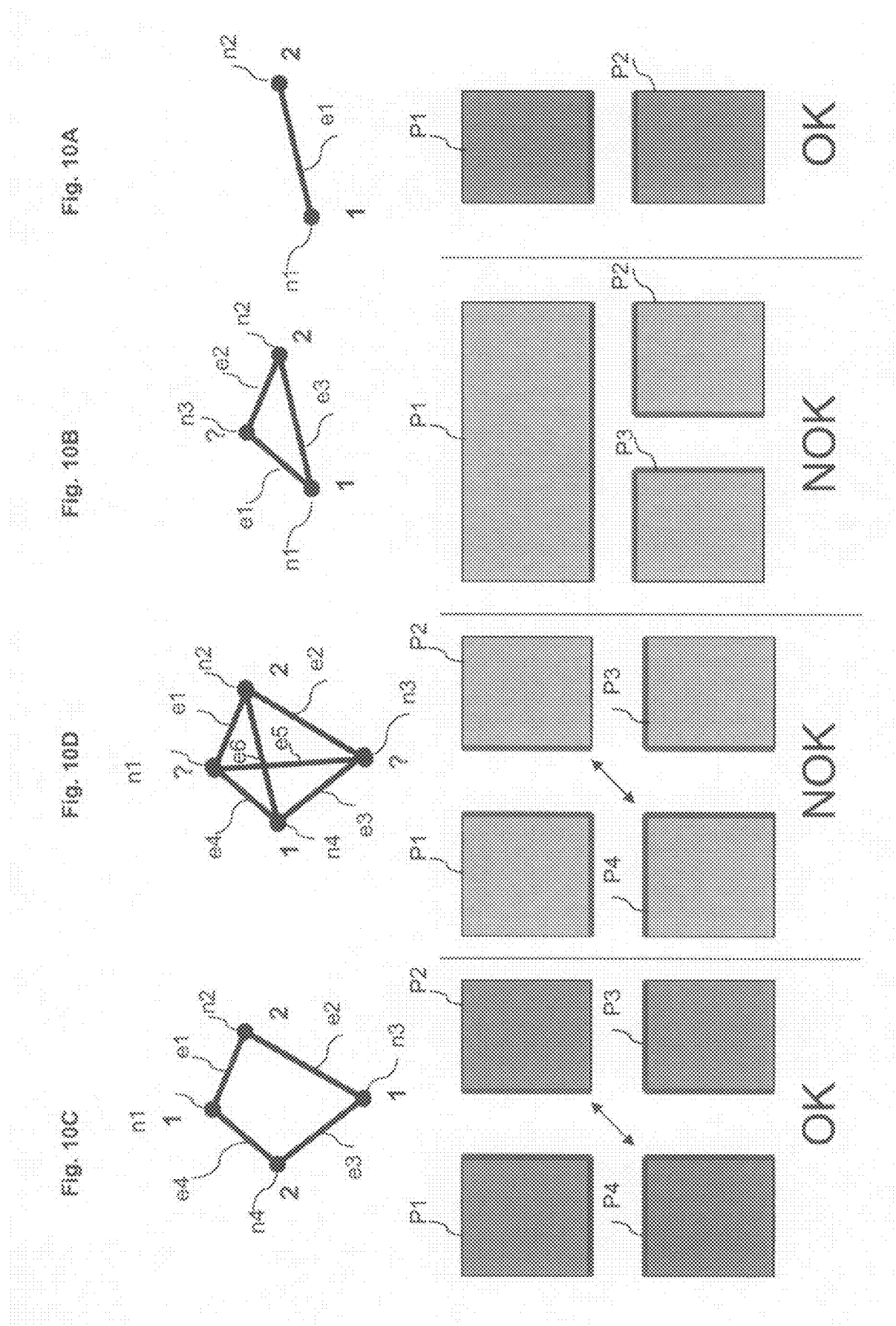

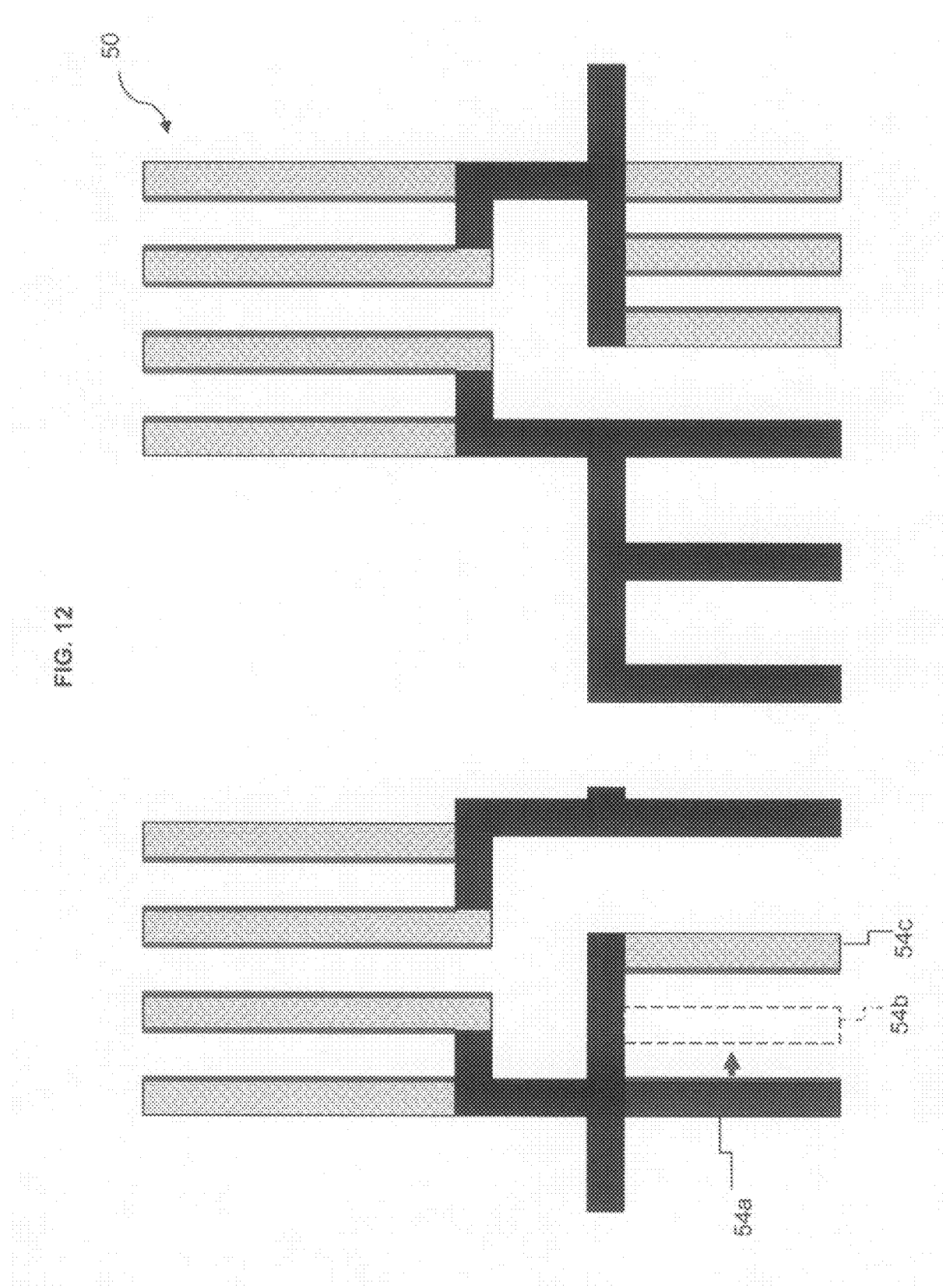

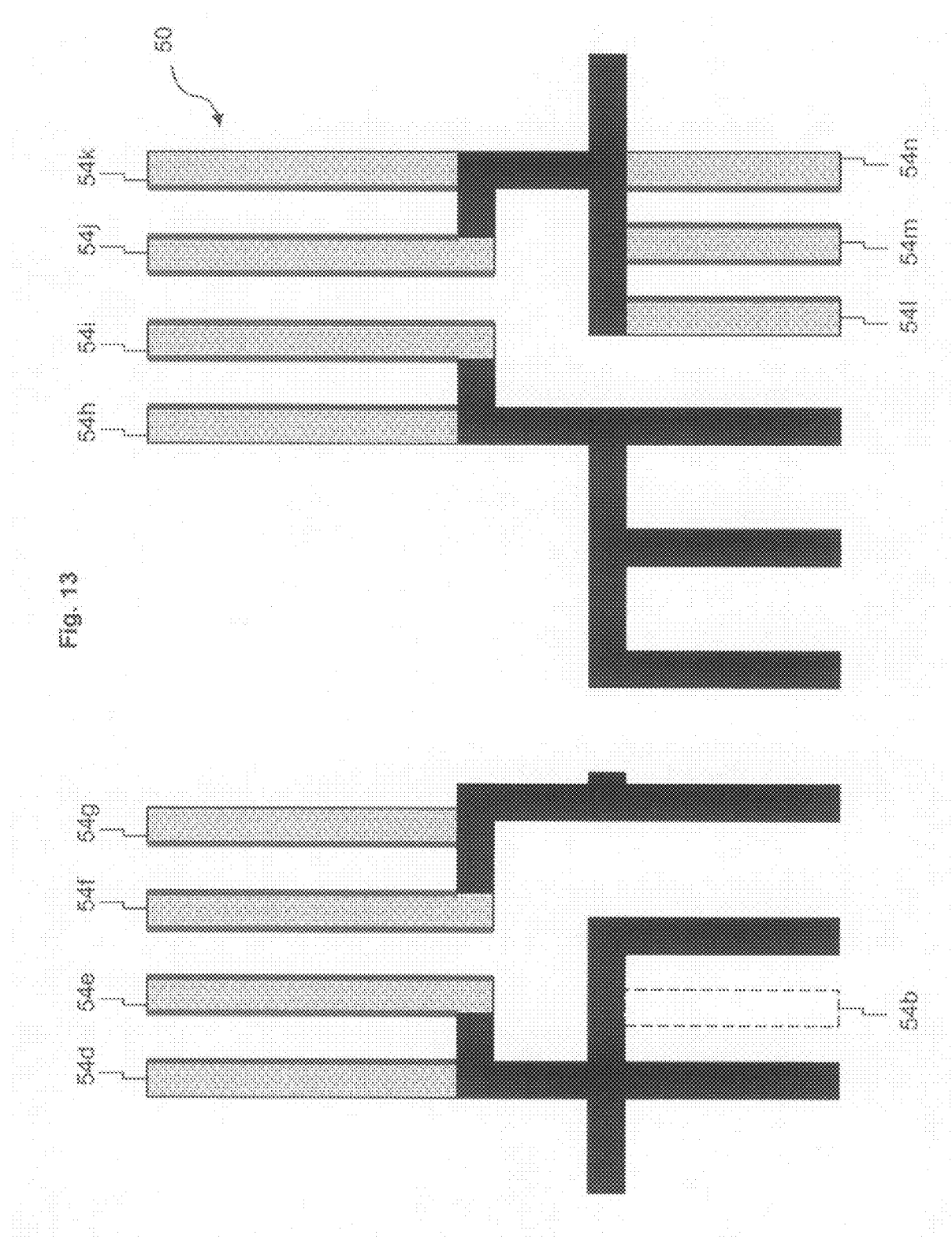

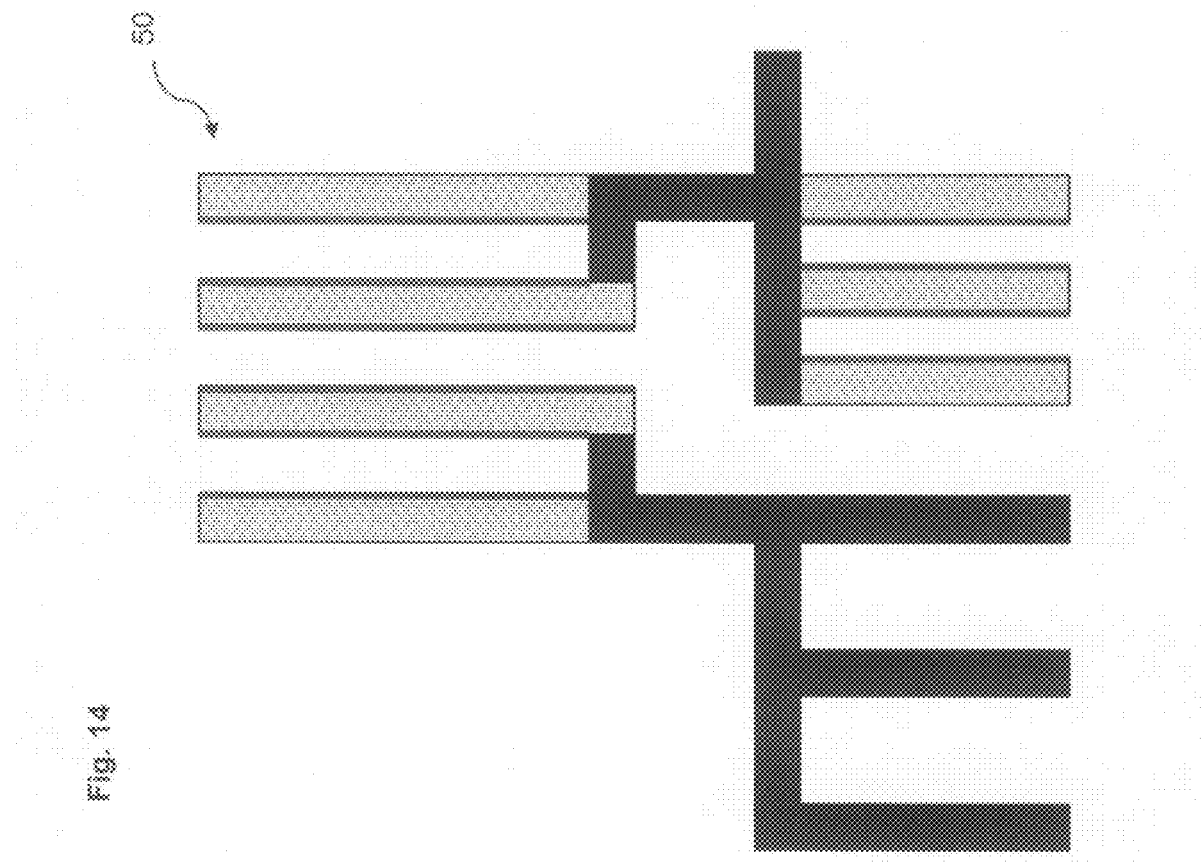
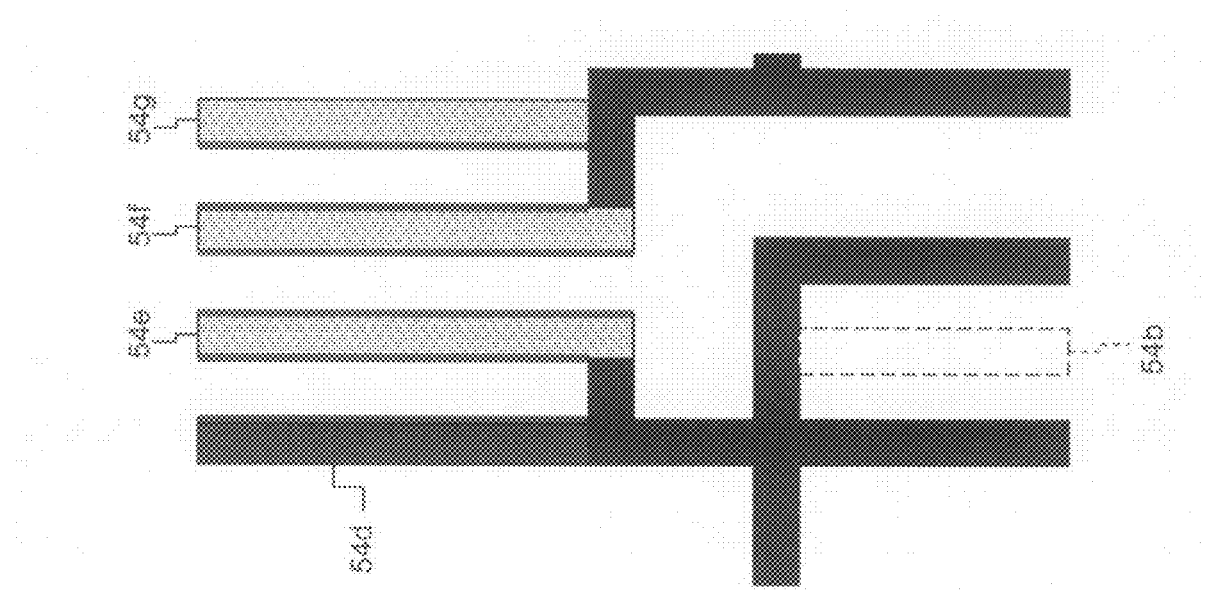
Fig. 14

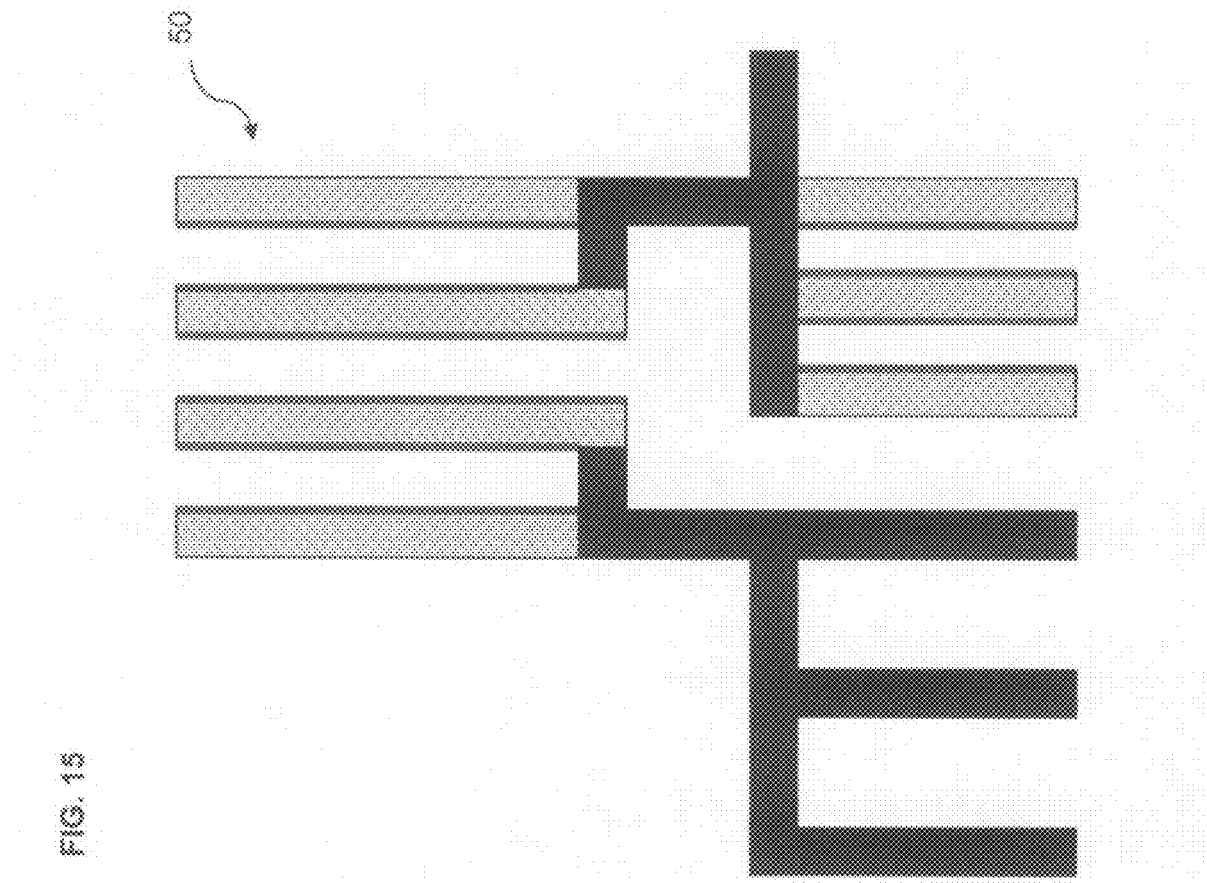
FIG. 15
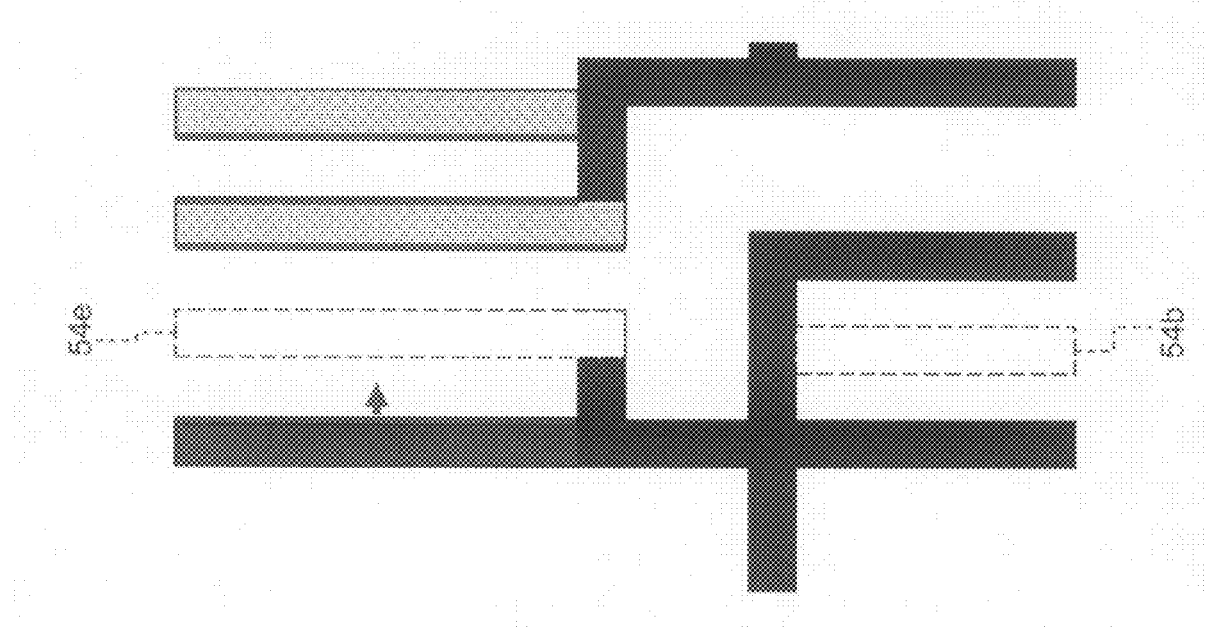

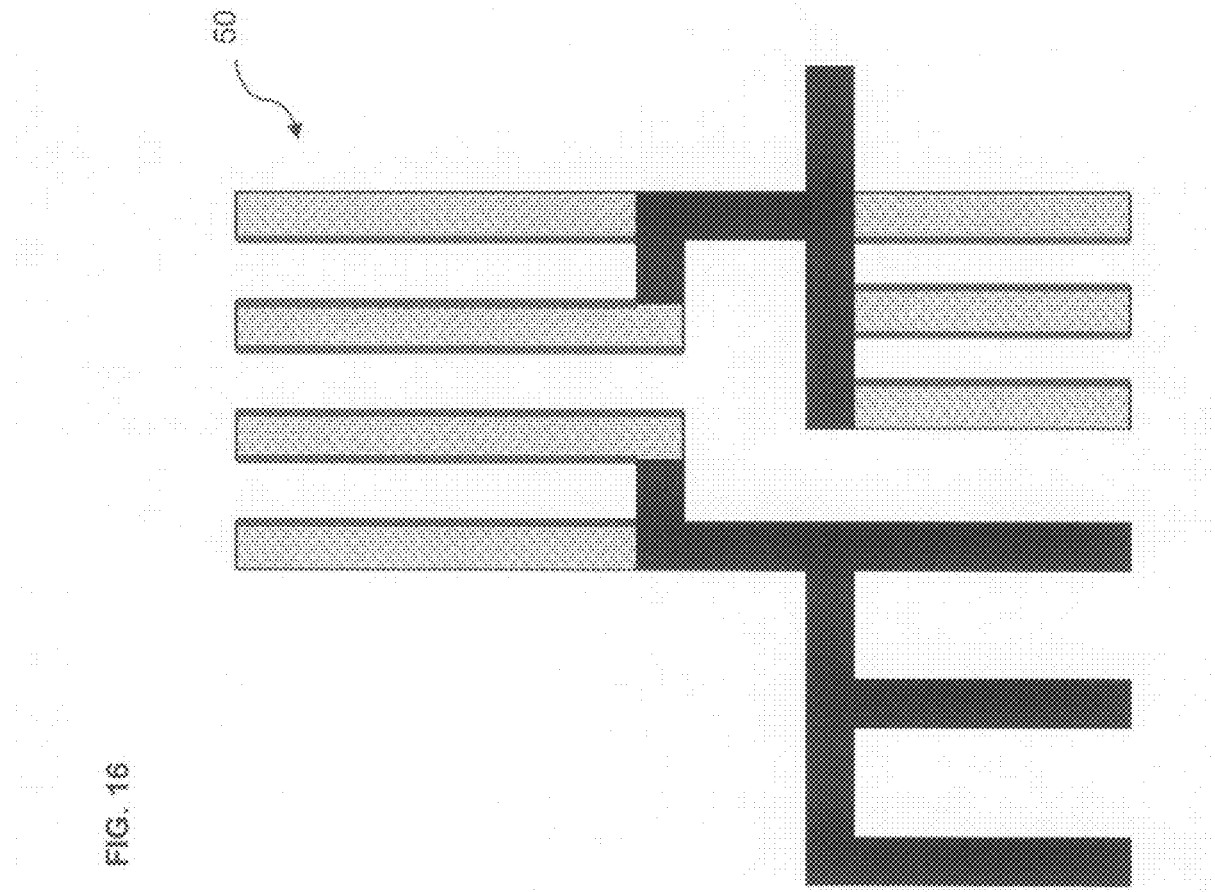
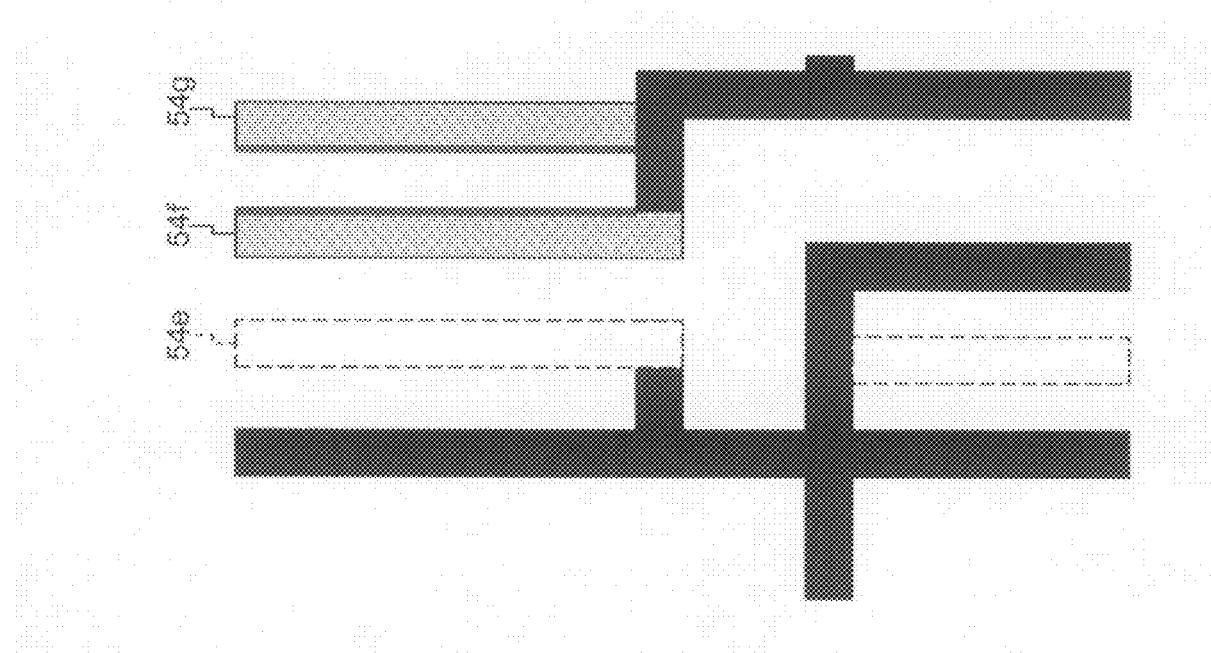
FIG. 16

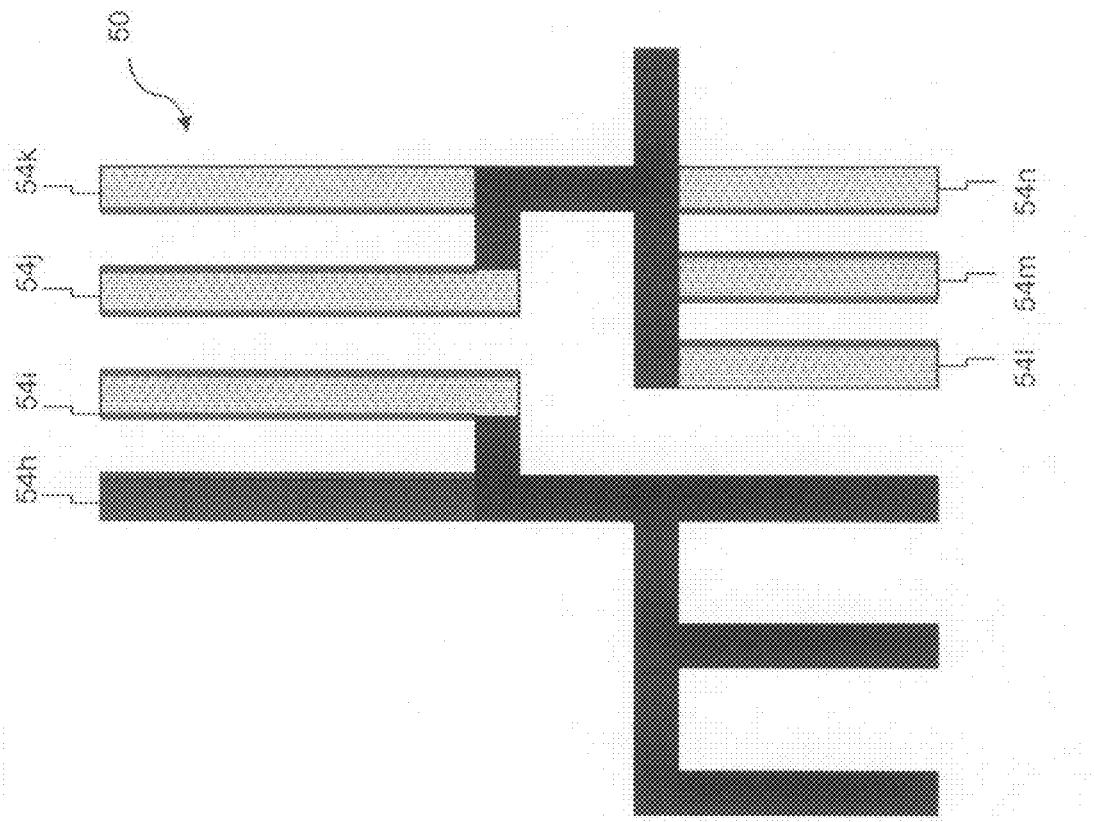
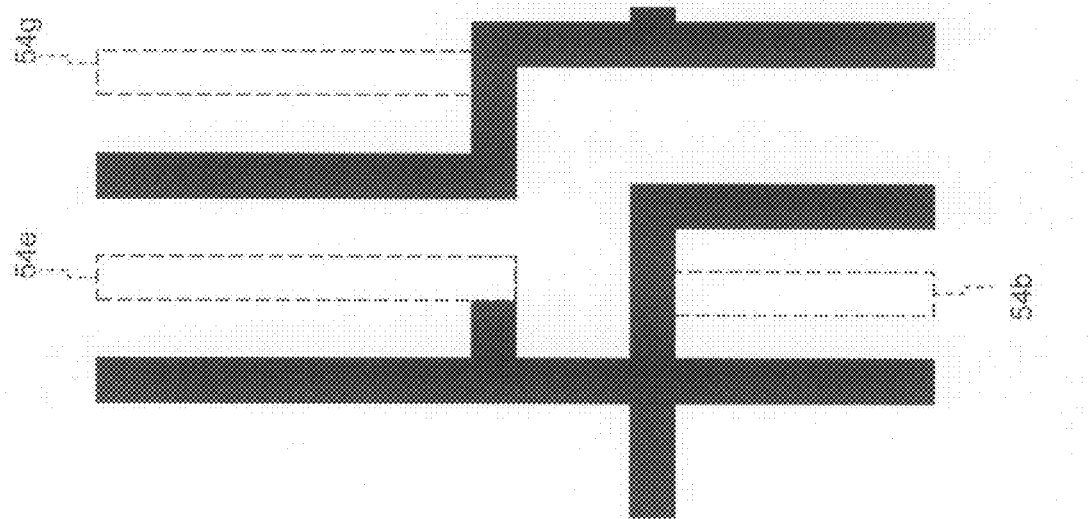
FIG. 20

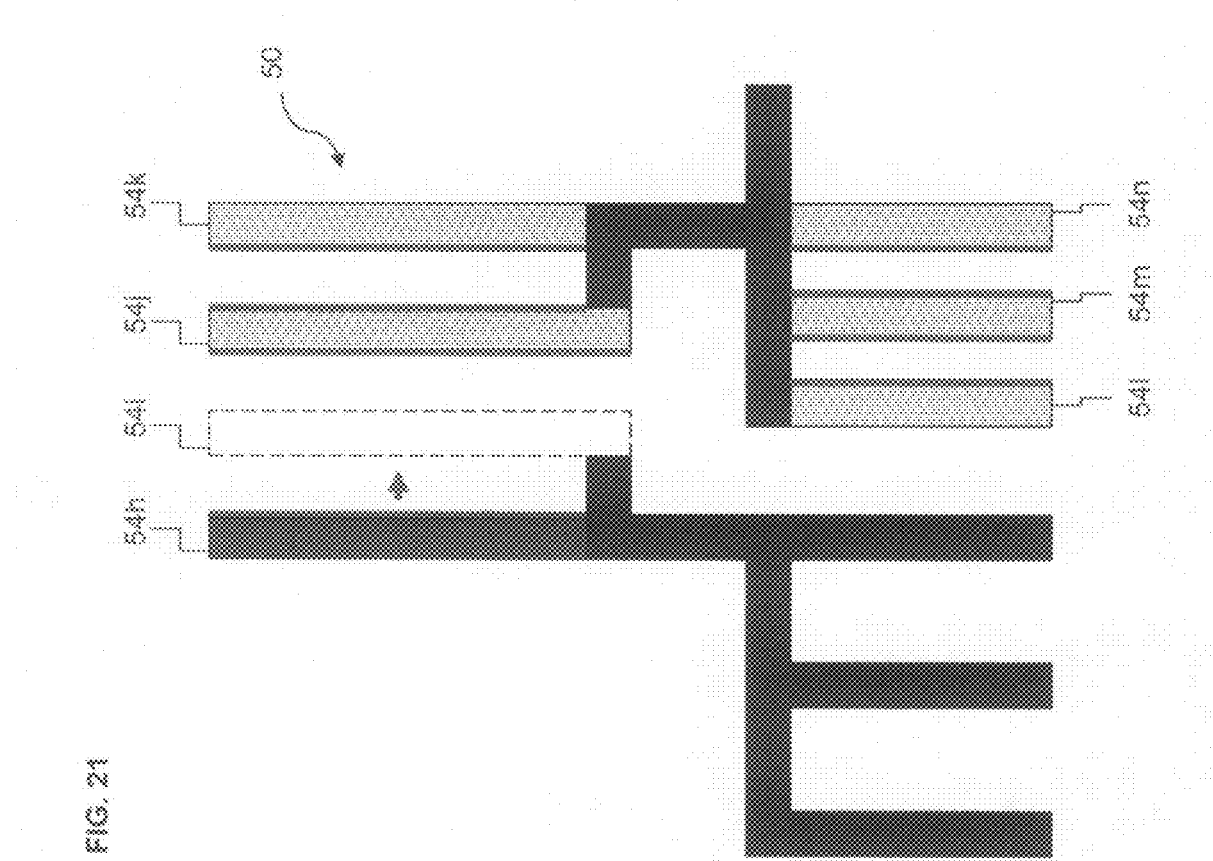
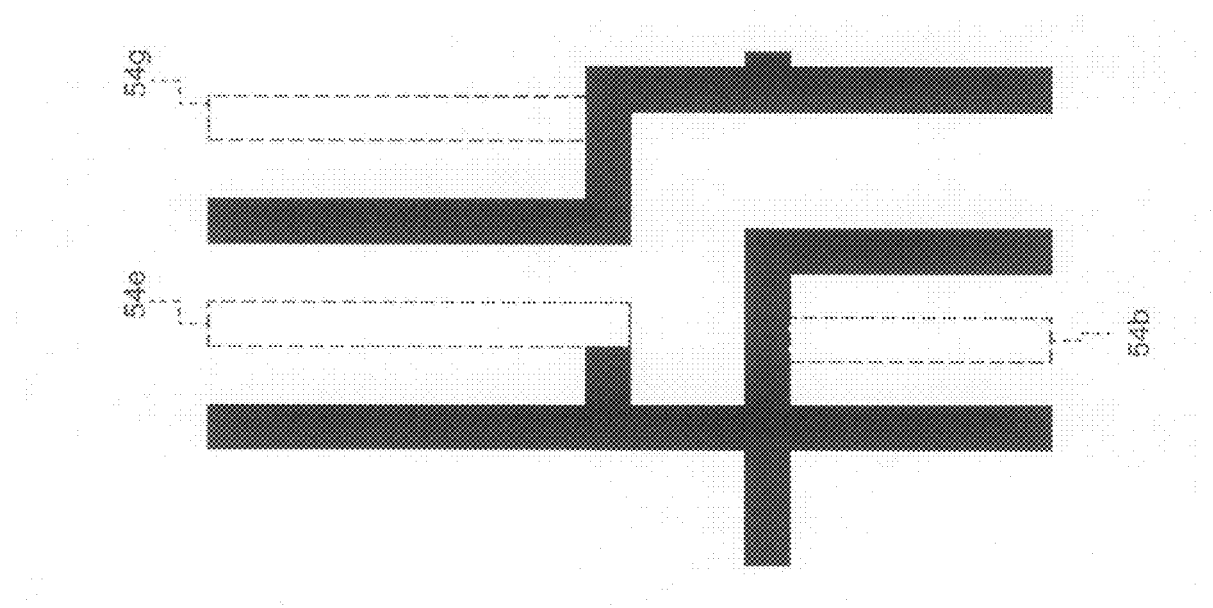

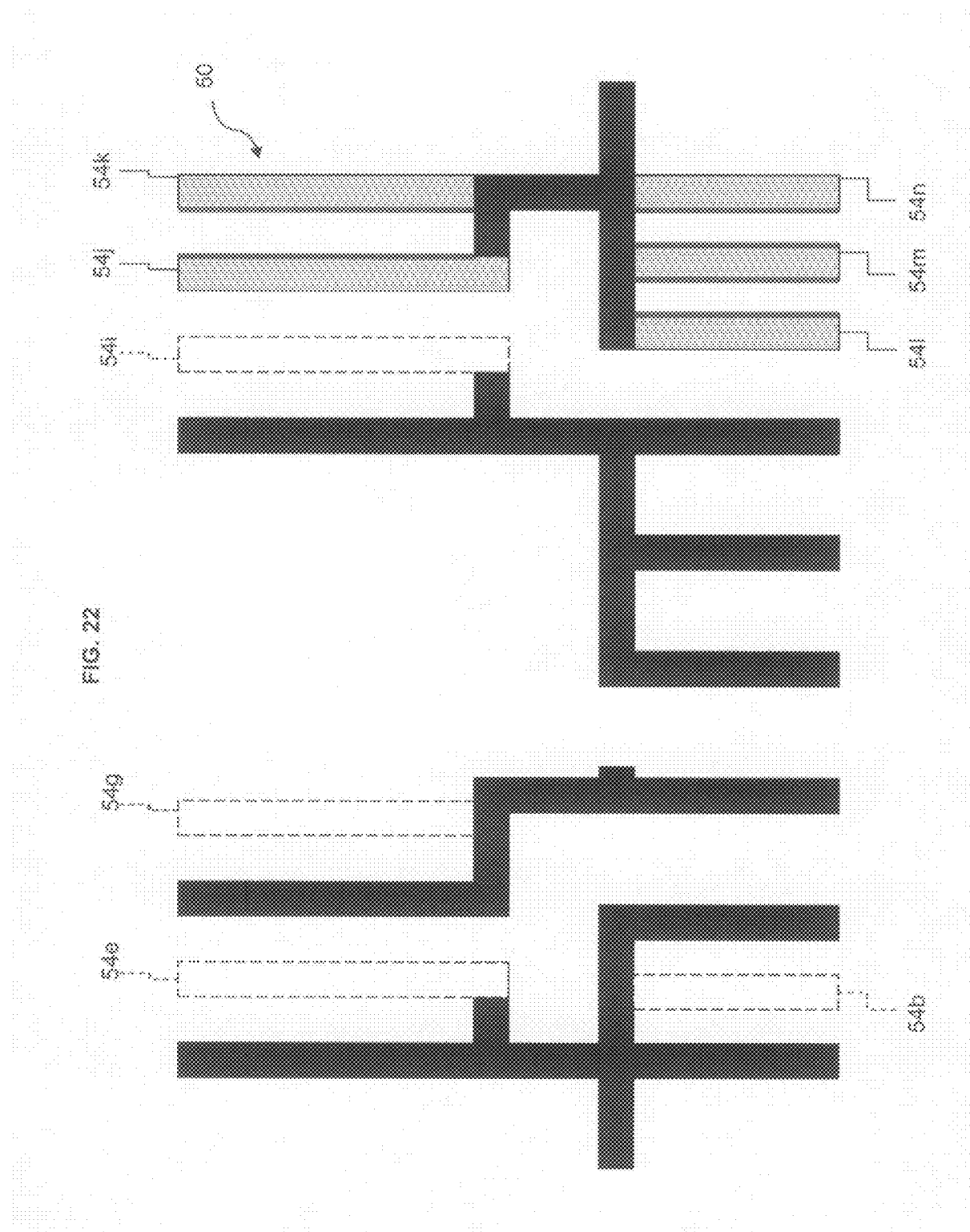

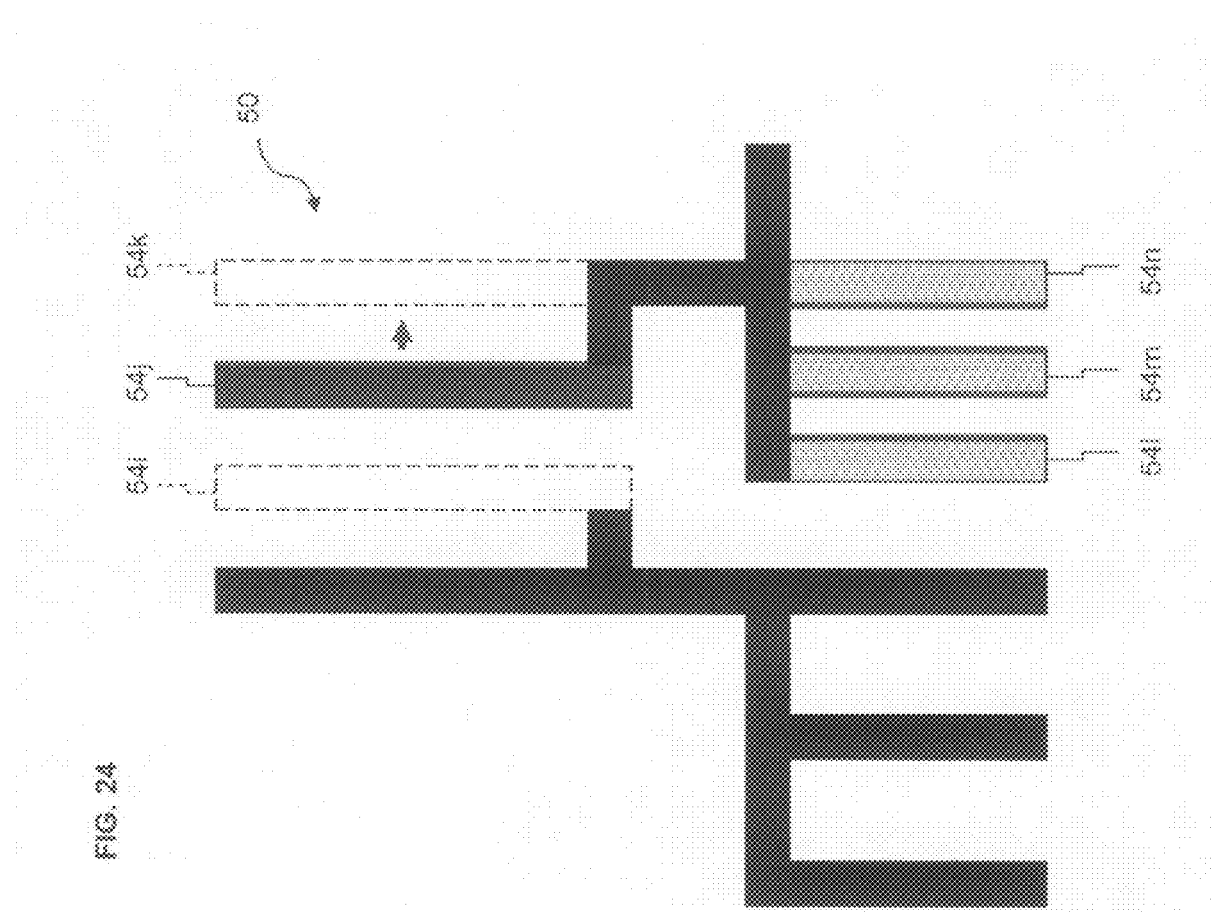
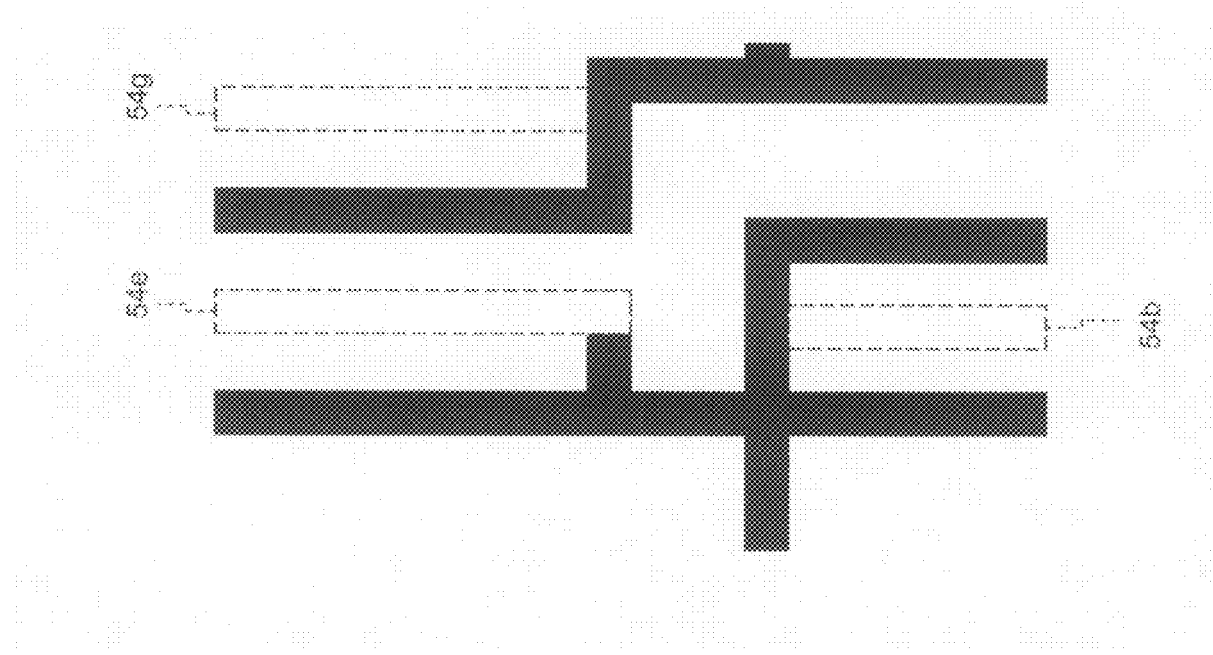
FIG. 24

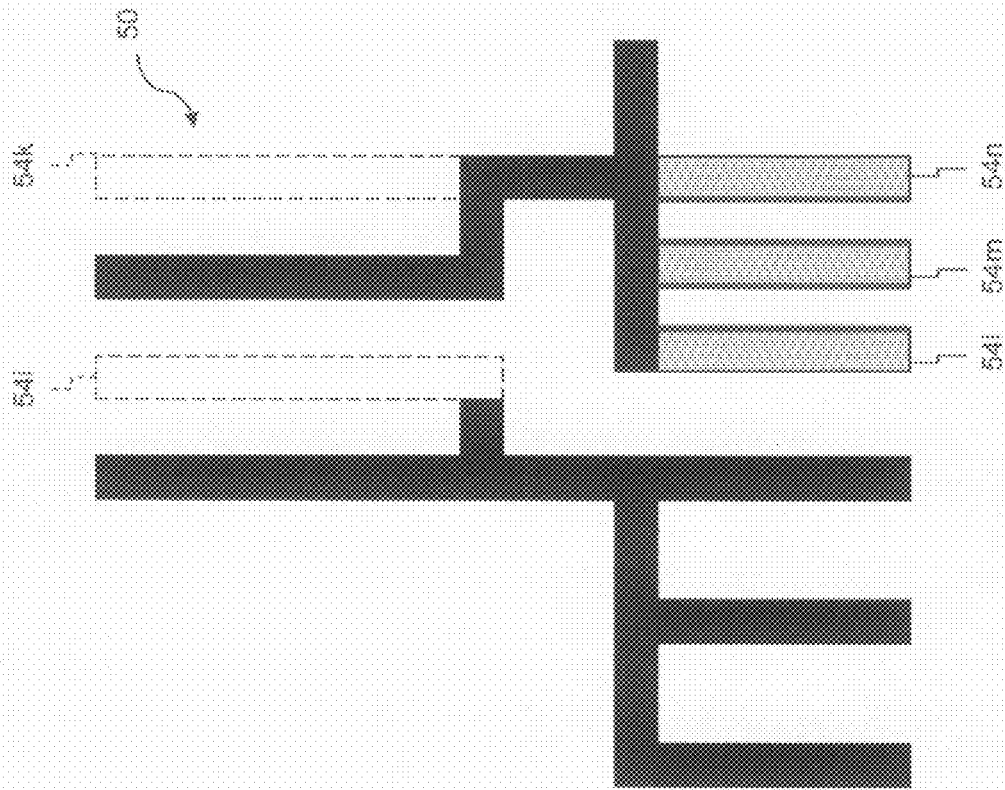
FIG. 25
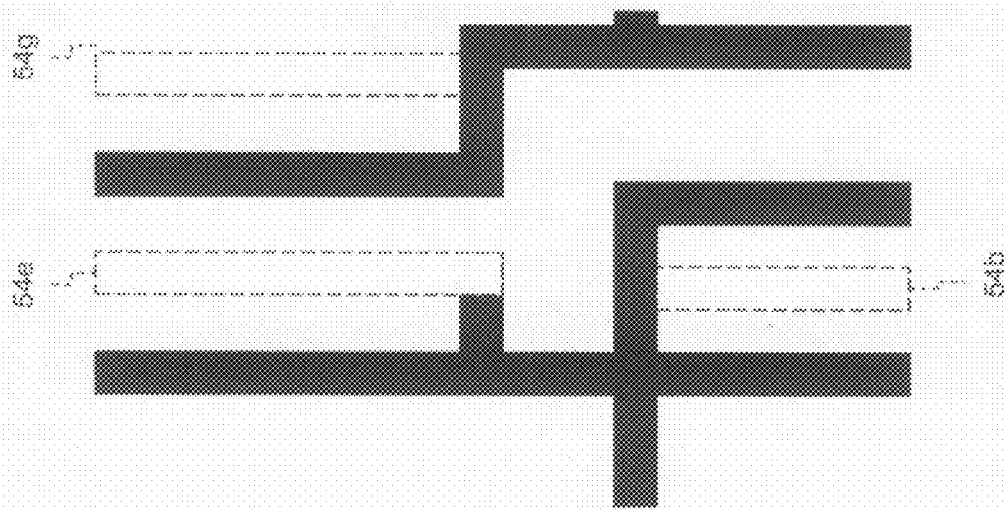

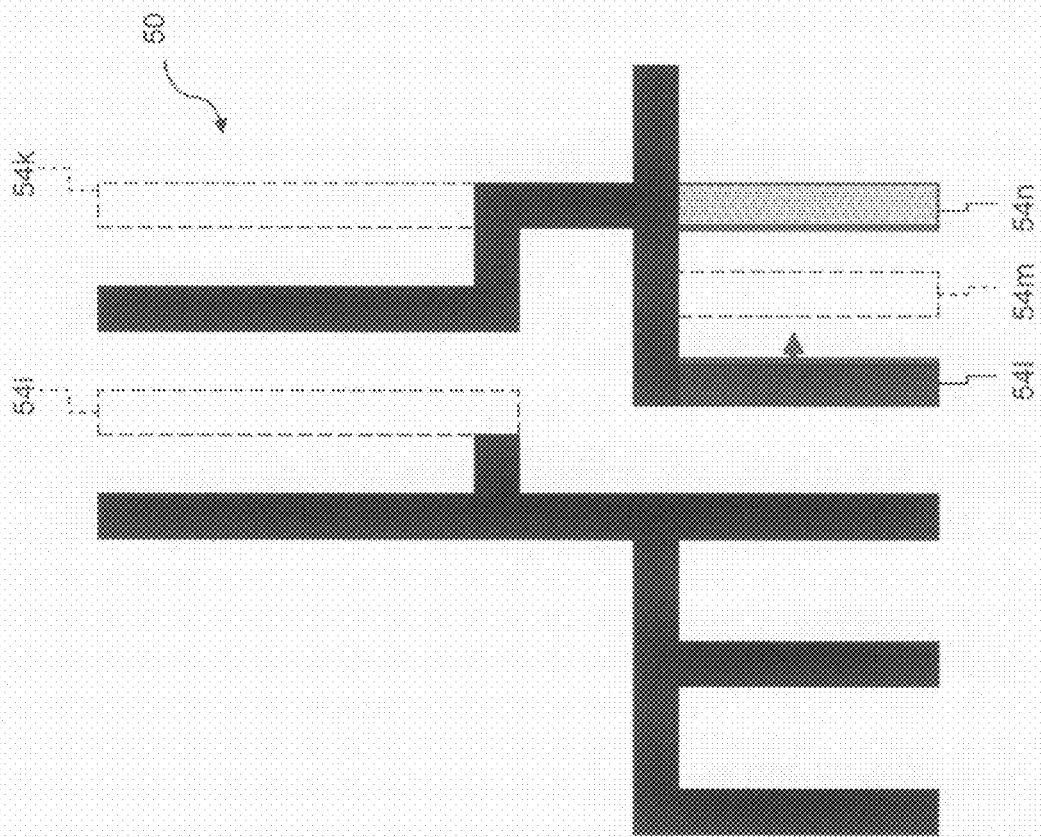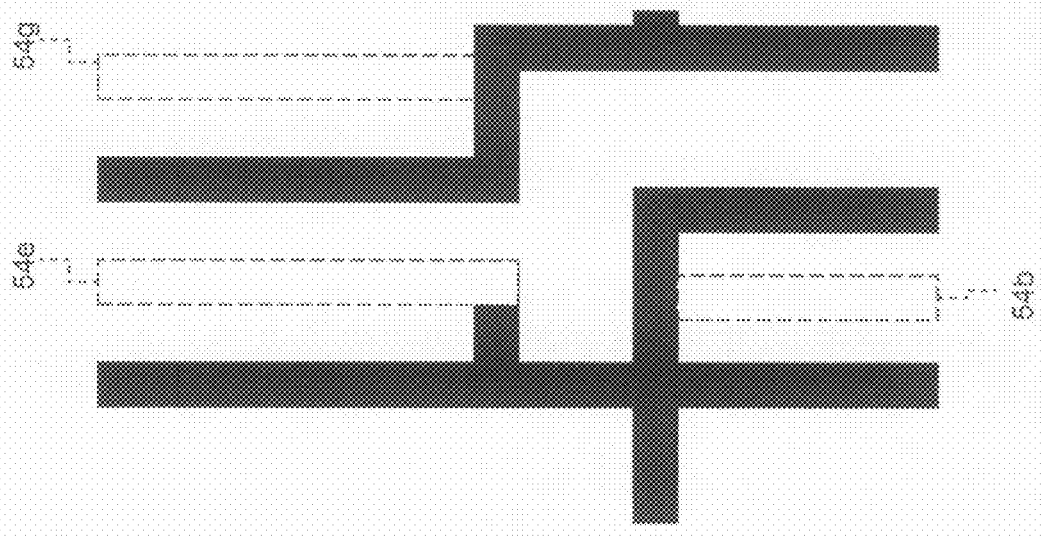
FIG. 27

APPARATUS AND METHOD FOR SEPARATING A CIRCUIT PATTERN INTO MULTIPLE CIRCUIT PATTERNS

RELATED APPLICATIONS

This application claims priority from U.S. Provisional Application No. 60/837,325, filed on Aug. 14, 2006, which is incorporated herein by reference.

FIELD OF THE INVENTION

This disclosure relates generally to a multi-patterning exposure method. More particularly, it relates to a method of separating a dense circuit pattern into less-dense circuit patterns for multi-patterning exposure.

BACKGROUND

Double-patterning is currently the subject of considerable research. Generally speaking, double patterning is an exposure method that involves splitting (i.e., dividing or separating) a dense circuit pattern into two separate, less-dense patterns. The simplified patterns are then printed separately on a target wafer utilizing two separate masks (where one of the masks is utilized to image one of the less-dense patterns, and the other mask is utilized to image the other less-dense patterns). Further, the second pattern is printed in between the lines of the first pattern such that the imaged wafer has, for example, a feature pitch which is half that found on either the two masks. This technique effectively lowers the complexity of the lithography process, improving the achievable resolution and enabling the printing of far smaller features than would otherwise be possible.

While it may be easy to determine how to separate a line: space pattern into two separate masks, it can be quite difficult to determine how to separate complex logic designs into separate masks. Current method for performing the separation process is typically complex, can fail to resolve conflicts and may require operation intervention.

Accordingly, it is an object of the present invention to provide a method and apparatus for automatically splitting complex circuit patterns into two or more less complex masks in an efficient and effective manner.

SUMMARY

This disclosure relates to a method, apparatus, and computer readable storage medium for storing a program for splitting/separating an original circuit pattern to be printed on a wafer, into multiple circuit patterns each of which is then imaged utilizing a separate mask dedicated to one of the less complex circuit patterns. In accordance with the present invention, circuit pattern data is obtained (e.g., of a target pattern), and then a simulation is performed to obtain an image log-slope (ILS), normalized image log-slope (NILS) or any other characteristic of an image quality on edges of polygons in the target circuit pattern. Next, properly printed edges and non-properly printed edges on the wafer are identified according to the ILS level of the given edge. Upon completion of the process, the original circuit pattern is separated into multiple circuit patterns, where each of the multiple patterns does not have any non-properly printed edges, and each of the multiple circuit patterns is imaged utilizing a separate mask.

In one aspect, the splitting step may include selecting a first polygon with a first non-properly printed edge among the polygons defined by the target pattern, and finding at least one second polygon with a second non-properly printed edge opposing to the first non-properly printed edge. It can be determined whether the second polygon can be separated from the first polygon based on a topological criterion, which is, for example, one first non-properly printed edge and 2n opposing second not-property printed edges (n: integer). The topological criterion may vary for different multi-patterning exposure methods. When it is determined that the second polygon can be separated (i.e., the topological criterion is not met), the second polygon may be separated from the first polygon and placed in a separate mask. On the other hand, when the topological criterion is met, the second polygon may not be separated from the first polygon. Such non-properly printed edges are utilized to identify features which are then in conflict with adjacent features. One of such features in conflict is then moved to a separate mask so as to resolve the conflict. The process is repeated until all conflicts in the target pattern, as defined by the non-properly printed edges, are resolved.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively.

The invention itself, together with further objects and advantages, can be better understood by reference to the following detailed description and the accompanying drawings.

BRIEF DESCRIPTION OF THE DRAWINGS

FIG. 4 is an exemplary diagram illustrating ILS-based pre-split fragmentation in accordance with an embodiment of the present invention.

FIGS. 5A-5C are exemplary diagrams illustrating the ILS-based pre-split fragmentation in accordance with an embodiment of the present invention.

FIG. 6 is an exemplary diagram illustrating selection of a seed fragment with a misprinted edge and an opposing fragment with a misprinted edge in accordance with an embodiment of the present invention.

FIGS. 9A-9E are exemplary diagrams illustrating topological criteria explaining what circuit patterns can be split in accordance with an embodiment of the present invention.

FIGS. 10A-10D are exemplary diagrams illustrating topological criteria explaining what circuit patterns can be split in accordance with an embodiment of the present invention.

FIG. 12 is an exemplary diagram illustrating separation of the opposing fragment from a polygon in accordance with an embodiment of the present invention.

FIG. 13 is an exemplary diagram illustrating a circuit pattern after the ILS-based pre-split fragmentation is performed in accordance with an embodiment of the present invention.

FIG. 14 is an exemplary diagram illustrating selection of a seed fragment with a misprinted edge and an opposing fragment with a misprinted edge in accordance with an embodiment of the present invention.

FIG. 15 is an exemplary diagram illustrating separation of the opposing fragment from a polygon in accordance with an embodiment of the present invention.

FIG. 16 is an exemplary diagram illustrating a circuit pattern after the ILS-based pre-split fragmentation in accordance with an embodiment of the present invention.

FIG. 20 is an exemplary diagram illustrating selection of a seed fragment with a misprinted edge and an opposing fragment with a misprinted edge in accordance with an embodiment of the present invention.

FIG. 21 is an exemplary diagram illustrating separation of the opposing fragment from a polygon in accordance with an embodiment of the present invention.

FIG. 22 is an exemplary diagram illustrating a circuit pattern after the ILS-based pre-split fragmentation is performed in accordance with an embodiment of the present invention.

FIG. 24 is an exemplary diagram illustrating separation of the opposing fragment from a polygon in accordance with an embodiment of the present invention.

FIG. 25 is an exemplary diagram illustrating a circuit pattern after the ILS-based pre-split fragmentation is performed in accordance with an embodiment of the present invention.

FIG. 27 is an exemplary diagram illustrating separation of the opposing fragment from a polygon in accordance with an embodiment of the present invention.

DESCRIPTION

Figure 1:
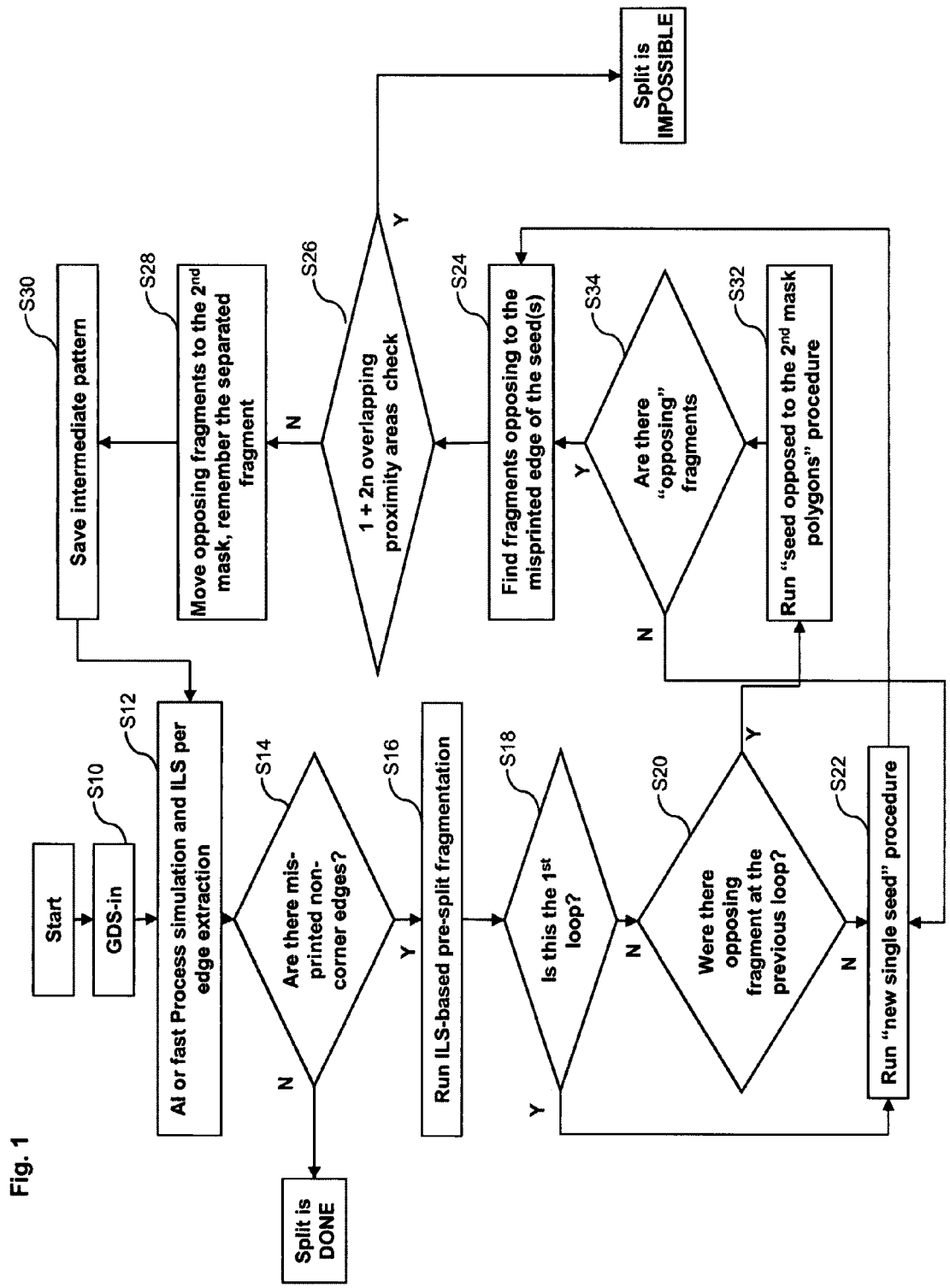
FIG. 1 is an exemplary flowchart illustrating a process of splitting one circuit pattern (i.e., target pattern) into two circuit patterns in accordance with an embodiment of the present invention.
Figure 2:
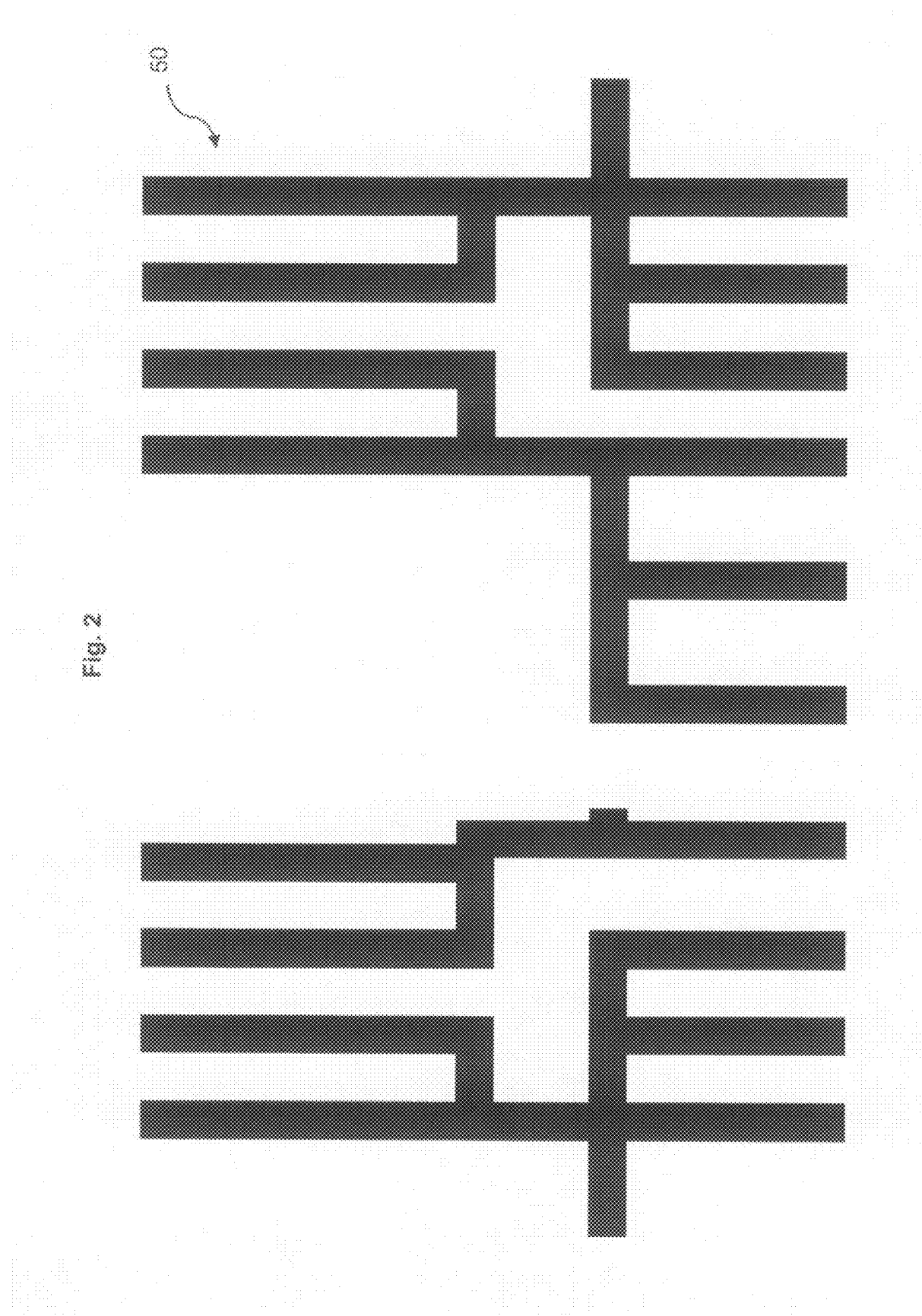
FIG. 2 is an exemplary diagram illustrating an original circuit pattern (i.e., target pattern) in accordance with an embodiment of the present invention.

The disclosure illustrates how to split or divide a dense circuit pattern (i.e., target pattern) into, but not limited to, two separate circuit patterns, which are imaged using separate masks, in a double-patterning exposure process. FIG. 1 is an exemplary flowchart illustrating a process of splitting or separating one circuit pattern (i.e., a target pattern) into first and second patterns, which can be utilized to form separate masks. The first step in the process, step S10, is to obtain a GDS (Graphic Data System) file, an industry standard file format for mask layout information, for the target pattern. FIG. 2 is an exemplary diagram illustrating an original circuit pattern or target pattern. In the following steps, this circuit pattern will be fragmented and split into two mask patterns. The target pattern depicted in FIG. 2 is defined or represented utilizing polygons 50 which is a standard way to represent features of the target pattern.

The second step in the process, step S12, is to perform a simulation process to obtain an image log-slope (ILS) or a normalized log-slope (NILS) on the edges of polygons 50 based on the GDS data. It is noted, however, that the target pattern may also be subjected to the OPC (optical proximity correction) or the RET (resolution enhancement techniques) processing before performing the simulation process. The gradient of the logarithm of an aerial image is called the ILS which represents an energy (intensity) gradient at positions of line edges of polygons 50. The ILS is known metric utilized to determine the performance of an imaging tool when imaging given features of the target pattern. As is known, it is possible to determine/quantify when a feature will image properly utilizing the ILS (e.g., a feature having a corresponding ILS value which is below a given number will not print, within acceptable error tolerances, while features having an ILS greater than the given number will print in an acceptable manner).

Figure 3:
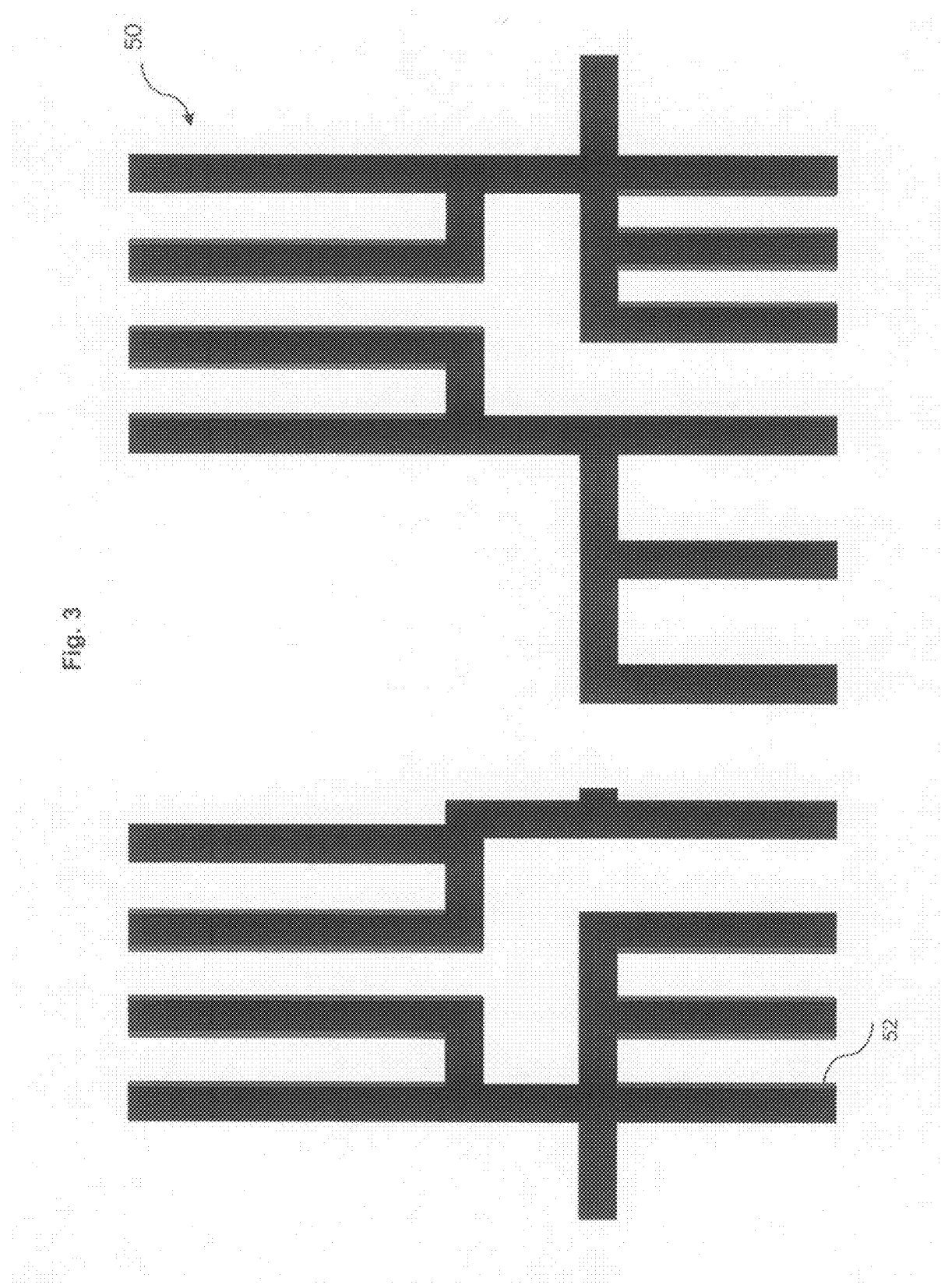
FIG. 3 is an exemplary diagram illustrating acceptable edges and misprinted edges of the features of the target pattern, which are represented as polygons, in accordance with an embodiment of the present invention.

The third step in the process, step S14, is to determine whether there are misprinted edges of polygons 50 which cannot be printed on a wafer properly, according to their corresponding ILS levels. It is noted that while the ILS is utilized as the primary criteria in the given example, it would also be possible to utilize other criteria capable of judging imaging performance, such as, but not limited to, NILS, aerial image contrast, and EPE (edge placement error) each of which could indicate the robustness of the printed feature. FIG. 3 is a diagram exemplarily showing a result of step 14, showing misprinted edges 52 in polygons 50. A misprinted edge is, for example, the edge which is too close to an opposing edge when the circuit pattern is printed on a wafer such that neither edge will image properly. To find misprinted edges 54, the process analyzes the ILS levels of edges and determines sections of misprinted edges (i.e., edges having an ILS value below the minimum) and sections of good edges (i.e., edges having ILS values greater than the minimum acceptable ILS value). Good edges are ones which will properly print on a wafer without interfering with the printing of an opposing edge, or being affected by the opposing edge. Polygons 50 are thus fragmented and split into two separate mask patterns such that a distance between edges is greater than the minimum resolution of the given process.

When the third step determines that there are no misprinted edges, the process is completed. If there are any remaining misprinted edges, the process proceeds to the next step.

The fourth step in the process, step S16, is to run an ILS-based pre-split fragmentation simulation. This step fragments polygons 50 in FIG. 3 into smaller polygons for preparation of splitting the circuit pattern into two mask patterns. FIG. 4 is an exemplary diagram illustrating polygons after the ILS-based pre-split fragmentation, in which misprinted edges 52 (see FIG. 3) are converted into fragments 54a-54n.

FIGS. 5A-5B exemplarily illustrate the ILS-based pre-split fragmentation in this embodiment. FIG. 5A shows an initial design which corresponds to the target circuit pattern. FIG. 5B shows the circuit pattern with identified misprinted edges 52 as a result of the simulation performed in step S12 (see FIG. 3). FIG. 5C shows fragments 54 (dotted areas) transformed from misprinted edges 52. As explained further below, the size (i.e., width) of fragments 54 is determined depending on a proximity range from an opposing edge (see dotted circles or ellipses in FIGS. 7 and 8). When an edge of a polygon is located within the minimum proximity or resolution range of an opposing edge, that edge will negatively affect or be overlapped with the opposing edge when they are printed on a wafer such that neither edge will image properly. Accordingly, areas of the target pattern within a given proximity range of opposing edges are transformed to fragments 54 such that, as discussed below in more detail, fragments 54 can be separated from polygons 50 and moved to another mask pattern, if necessary. FIG. 5C depicts such fragments 54.

The sixth step in the process, step S18, is to determine whether the process currently being performed is in a first loop of the flowchart. When the first loop is being performed, the process proceeds to step S22, and when the loop being performed is not the first loop, the process proceeds to step S20. In this example, it is assumed that the first loop is being performed and the process proceeds to step S22.

The seventh step in the process, step S22, is to run a "new single seed" procedure. FIG. 6 illustrates selection of a seed fragment with a misprinted edge. In this example, a fragment located at a corner of the circuit pattern, but not limited to that fragment, is given priority to be a seed fragment. Any fragment can, of course, be selected as a seed fragment. The seed fragment here is defined as one fragment with at least one misprinted edge, from which it is determined whether one or more other fragments can be separated from polygon 50. In FIG. 6, fragment 54a with misprinted edge 52a is selected as a seed fragment.

The eighth step in the process, step S24, is to find fragments with a misprinted edge opposing the seed polygon. In FIG. 6, fragment 54b has a misprinted edge 52b opposing misprinted edge 52a of seed fragment 54a. Accordingly, fragment 54b is selected as an opposing fragment and is analyzed to determine if the fragment can be separated from polygon 50 and moved to the second mask pattern.

The ninth step in the process, step S26, is to determine whether the opposing fragment can be separated from the original polygon. FIGS. 7-11 exemplarily illustrate a topological criterion as to what circuit patterns can be split. In this example, a graph utilized to determine if a fragment can be separated, is introduced.

Figure 7:
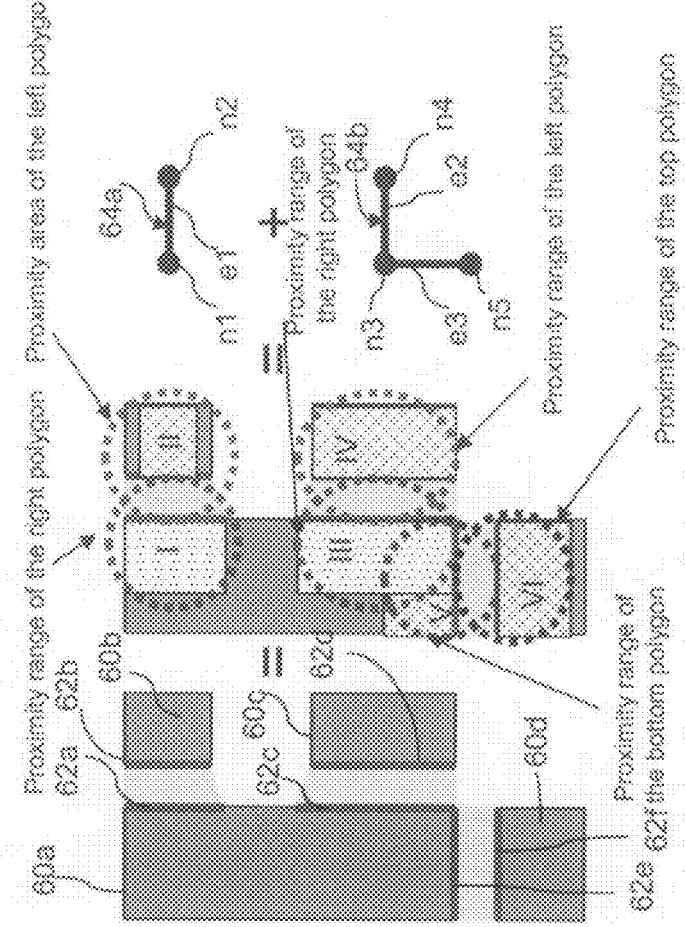
FIG. 7 is an exemplary diagram illustrating fragments and graphs in accordance with an embodiment of the present invention.

FIG. 7 shows four polygons 60a to 60d, each of which has a misprinted edge. Misprinted edges 62a to 62f are identified based on the ILS level. Dotted areas I to VI represent fragments explained according to FIGS. 4 and 5C. Dotted circles and ellipses in FIG. 7 indicate proximity ranges from an opposing edge. As briefly explained above, the size of fragments I to VI is determined depending on such proximity ranges from the corresponding opposing edges. Determination of the proximity range may be performed by moving the opposite polygon from the evaluating edge and repeating ILS (or other) simulations. A range obtained based on such determination that the simulated ILS is below a printability threshold is the proximity range (dotted circles). This process may be simplified by setting the proximity range equal to a minimal printed pitch. For example, if a minimal feature size (minimal design rule) is equal to a minimal space, a bad edge inside a polygon may be expanded by the minimal feature size (minimal design rule).

In FIG. 7, polygon 60a overlaps with polygons 60b, 60c, and 60d, respectively, while polygons 60b and 60c do not have edges overlapping with each other. For example, to avoid an edge of polygon 60a from overlapping with an opposing edge of polygon 60b, fragment I or fragment II needs to be moved to another mask pattern.

Graphs 64a and 64b, shown in FIG. 7, represent a relationship among polygons 60a-60d in this example. In graphs 64a and 64b, nodes n1-n5 correspond to fragments I-VI in polygons 60a-60d, and edges e1-e3 correspond to spaces between edges 62a and 62b, 62c and 62d, and 62e and 62f, respectively. For example, fragments I and II are disposed, between which there is a space where proximity range from edges 62a and 62b overlap with each other (i.e., too close to one another). This is indicated by graph 64a having two nodes n1 and n2 connected by one edge e1.

Graph 64b has three nodes n3-n5 which correspond to fragments III, IV, and VI. All misprinted edges of overlapping fragments in a polygon can be considered to be one edge. Accordingly, misprinted edges 62c and 62e of fragments III and V are considered to be one edge and are treated as node n3 in graph 64b. Nodes n3 and n4 are connected by edge e2, and nodes n3 and n5 are connected by edge e3. However, nodes n4 and n5 are not connected by any edge because polygons 60c and 60d do not have misprinted edges opposing to each other.

Figure 8:
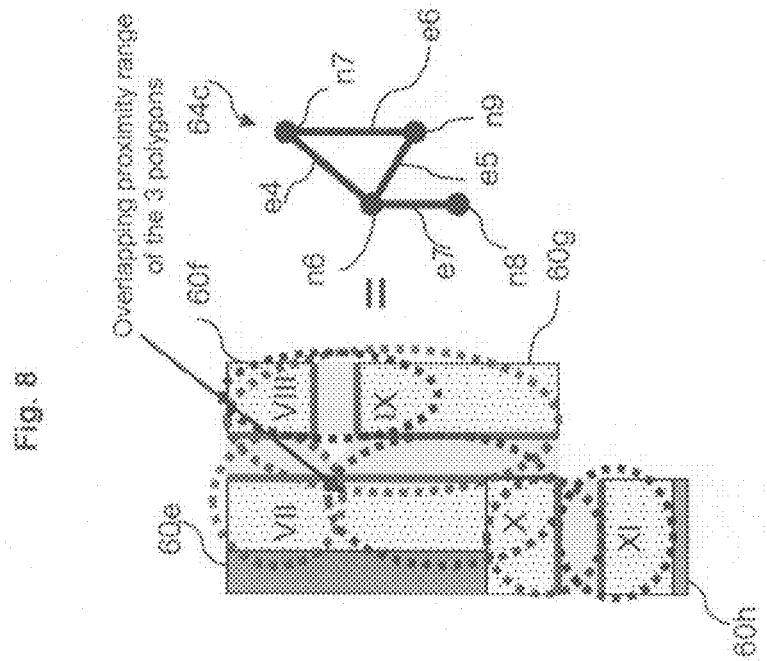
FIG. 8 is an exemplary diagram illustrating fragments and graphs in accordance with an embodiment of the present invention.

FIG. 8 shows an example of four polygons 60e-60h which are similar to the polygons in FIG. 7. The difference between the polygons in FIG. 8 and those in FIG. 7 is that polygons 60f and 60g do not have misprinted edges opposing each other, and a proximity range from polygon 60e covers both polygons 60f and 60g. Since all misprinted edges of overlapping fragments in polygon 60e can be considered to be one edge under the exemplary rule of the given process, the edges of fragments VII and X are considered as one node, i.e., node n6 in graph 64c. The edges of polygon 60f opposing polygons 60e and 60g, respectively, are considered to be one edge and are treated as node n7 in graph 64c. The edges of polygon 60g opposing the edges of polygons 60e and 60g, respectively, are also considered to be one edge and are treated as node n9. The edge of polygon 60h opposing the edge of polygon 60e is treated as node n8. In graph 64c, node n6 is connected to node n7 by edge e4, connected to node n9 by edge e5, and connected to node n8 by edge e7. Node n7 is also connected to node n9 by edge e6.

It should be noted that all edges of the polygon pointed to by the arrow in FIG. 5C can be considered to be one edge which turns out to be one node in a graph. This is because, in this example, the polygon is within the proximity range (which results in imaging interference) on each of its edges.

The foregoing graphs indicate a topological criterion as to what configurations of nodes can be split, i.e., whether a particular polygon (e.g., opposing fragment 54b in FIG. 6) can be separated from another polygon (e.g., seed fragment 54a in FIG. 6). This process will be explained with reference to FIGS. 9A to 9D.

As shown in FIG. 9A, when a graph has two nodes n1 and n2 connected by one edge e1, two nodes can be split into separate masks, which are then imaged separately. Numbers "1" and "2" in FIG. 9A indicate masks to which nodes n1 and n2 are assigned, respectively. In other words, node n1 is assigned to the first mask pattern, while node n2 is assigned to the second mask pattern.

FIG. 9B shows an exemplary triangle-shaped graph having three nodes n1-n3 and three edges e1-e3 (triangle loop of nodes). This graph illustrates that nodes n1-n3 cannot be split from each other under the double-patterning exposure method. For example, assuming that nodes n1 and n2 are assigned to the first and second mask patterns, respectively, there is no mask pattern to which node n3 can be assigned. In other words, if nodes n1 and n3 are assigned to the first mask pattern and node n2 is assigned to the second mask pattern, nodes n1 and n3, i.e., edges of two opposing polygons, overlaps with each other and cannot properly be printed on a wafer.

FIG. 9C shows an exemplary squire-shaped graph having four nodes n1-n4 and four edges e1-e4. In FIG. 9C, nodes n1 and n3 can be assigned to the first mask pattern, and nodes n2 and n4 can be assigned to the second mask pattern. Accordingly, the graph in FIG. 9C indicates that nodes n1-n4 can be split into two mask patterns. FIG. 9D shows an exemplary pentagon-shaped graph having five nodes n1-n5 and five edges e1-e5. Similar to the graph in FIG. 9B, this graph has a problem in that node n5 cannot be assigned either to the first mask pattern or the second mask pattern because when placed in either the first or second mask, it will cause interference with either n3 or n4.

In short, FIGS. 9A-9D shows that when a graph has a triangle-shape or pentagon-shape formed by connecting nodes, splitting a circuit pattern into two mask patterns cannot be achieved. In contrast, as shown in FIG. 7, the graph having three nodes n3-n5 and two edges e1 and e2 connecting nodes n3 and n4, shows that a circuit pattern represented by such a graph can be split into two mask patterns. This is so because the graph in FIG. 7 does not have a triangle-shape, i.e., nodes n4 and n5 are not connected by an edge. For example, polygon 60a can be assigned to the first mask pattern, and polygon 60c and 60d can be assigned to the second mask pattern. Accordingly, even if there are three nodes in a graph, splitting a circuit pattern into two patterns is possible unless the graph includes three edges forming a triangle shape.

It should be noted that the topological criterion may vary for different multi-patterning exposure methods. An unsplittable configuration under the double patterning method may become splittable under a triple-patterning method. FIG. 9E shows tetrahedron configuration which cannot be split even by the triple patterning.

More practical examples will be discussed with reference to FIGS. 10A-10D. FIG. 10A shows two polygons p1 and p2 corresponding to a graph having two nodes n1 and n2, and one edge e1 (see FIG. 9A). One edge of polygon p1 overlaps with one edge of polygon p2. As already explained above, the graph indicates that these polygons p1 and p2 can be split into the first and second mask patterns. FIG. 10B shows three polygons corresponding to a triangle-shaped graph having three nodes and three edges (see FIG. 9B). These polygons p1, p2, and p3 cannot be split into the first and second mask patterns because, as explained above, the graph has a triangle-shape with three nodes and three edges. FIG. 10C shows four polygons p1-p4 corresponding to a square-shaped graph having four nodes and four edges (see FIG. 9C). In FIG. 10C, it is assumed that a diagonal corner-to-corner space pointed by an arrow has an enough space such that neither nodes n2 and n4, or n1 and n3 overlap or are within proximity of one another so as to prevent proper imaging. Because the graph in FIG. 10C does not have a triangle-shape or a pentagon-shape, polygons p1-p4 can be split into two mask patterns. FIG. 10D shows four polygons p1-p4 corresponding to a square-shaped graph having four nodes and six edges. The graph in FIG. 10D has additional edges e5 and e6 diagonally connecting nodes nil and n3, and nodes n2 and n4, respectively. These additional edges illustrate that a diagonal corner-to-corner space pointed by an arrow does not have an enough space to avoid overlapping with polygons p1-p4. Accordingly, for example, nodes n4 and n2 can be assigned to the first and second mask patterns, but there are no mask patterns to which nodes n1 and n3 can be assigned that would not result in interference. Accordingly, polygons p1-p4 cannot be split into two mask patterns.

Figure 11B:
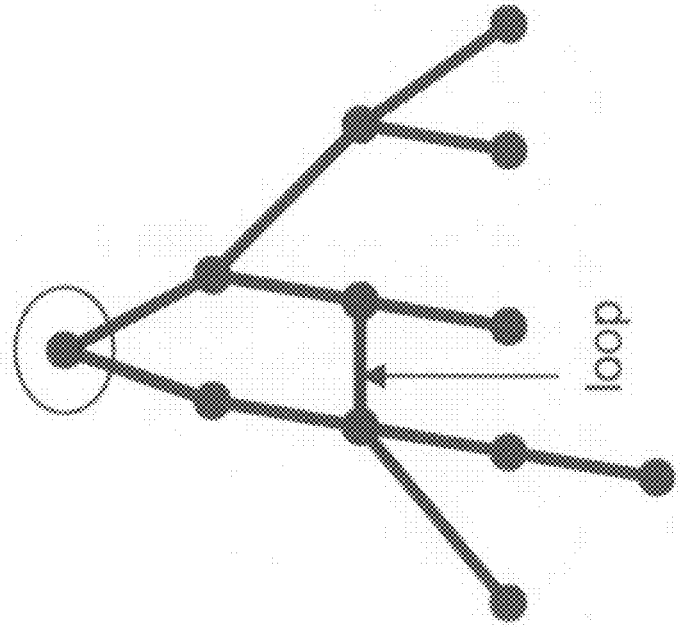
FIGS. 11A and 11B are exemplary diagrams illustrating a topological criterion explaining what circuit patterns can be split in accordance with an embodiment of the present invention.
Figure 11A:
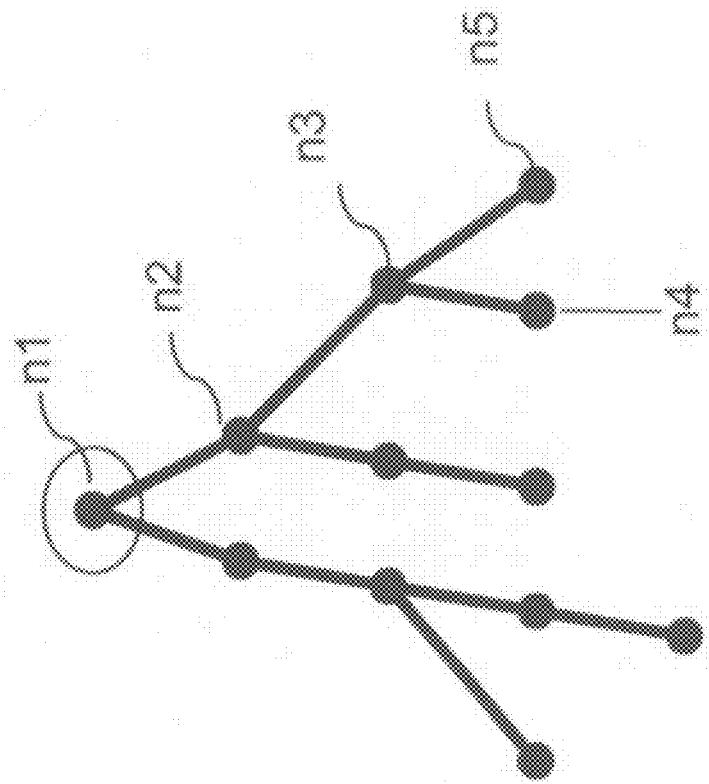

In addition, FIG. 11A shows a graph in which all nodes are serially connected by edges to form a tree. This graph is referred to as the "tree of graphs" in this disclosure. A circuit design corresponding to this tree of graphs can be split into two mask patterns. In contrast, a graph shown in FIG. 11B is not the tree of graphs because it has a closed loop formed therein, for example, a pentagon-shape. A circuit design corresponding to the graph of FIG. 11B cannot be split into two mask patterns. The definition of the tree of graphs is that all nodes are connected by edges, but there is no loop with an odd number nodes. As described above, FIG. 6 illustrates that a seed fragment is selected to split a circuit pattern into two mask patterns. Such an idea of employing the seed fragment is derived from the tree of graphs in FIG. 11A. For example, assuming that a fragment corresponding to node n1 in FIG. 11 is selected as a seed fragment (step S22 in FIG. 1), a fragment corresponding node 2 is selected as an opposing fragment (S24 in FIG. 1). Then, the opposing fragment is separated and assigned to the second mask pattern (described below) because the seed fragment and the opposing fragment can be described by a graph shown in FIG. 10A. Then, a fragment corresponding to node n3 is selected as the next seed fragment (S20 in FIG. 1 described below), and a fragment corresponding to node 4 is selected as an opposing fragment and is separated (S32 and S34 in FIG. 1 described below).

Returning to FIG. 1, in step S26, fragments can be split into the first and second mask patterns as long as the topological criterion shown in, for example, FIGS. 10B and 10D is not present. In other words, if the edges of a graph corresponding to a seed fragment and an opposing fragment (or opposing fragments) connects to an odd number of nodes to form a loop (triangle, pentagon, and so forth), these fragments cannot be split into two circuit patterns. Referring again to FIG. 6, as see fragment 54a and opposing fragment 54b do not connect to an odd number of nodes or form a loop, seed fragment 54a and opposing fragment 54b can be split into the first and second mask patterns. When seed fragment 54a and opposing fragment 54b cannot be split, the process may stop or may generate a flag regarding those fragments and proceeds to the next step in such situations. The original target mask pattern may need to be redesigned, or tolerances adjusted, if possible. On the other hand, when fragments can be split, the process proceeds to step S28 in FIG. 1.

The tenth step in the process, step S28, is to separate opposing fragment 54b from polygon 50 and assign it to the second mask pattern, and save a location (dotted line) of opposing fragment 54b, as shown in FIG. 12. The eleventh step in the process, step S30, is to save/store the first mask from which fragment 54b has been removed, as well as the second mask to which fragment 54b has been added. The process, then, goes back to step S12 to enter into the second loop, so as to repeat the foregoing process until all of the polygons 50 having misprinted edges (54d-54n) have been processed.

More specifically, in step S18, the process determines whether the current process is in the first loop in the flowchart of FIG. 1. Because the second loop of the process is currently being performed, the process proceeds to step S20 to determine whether there are fragments with a misprinted edge opposing to separated fragment 54b. As shown in FIG. 12, since there is fragment 54c opposing to separated fragment 54b, the process proceeds to step 32 to run a "seed opposed to the separated fragment" procedure to specify fragment 54c as a seed fragment, and determine whether there are opposing fragments in step S34. However, fragment 54c does not have any opposing fragment (see FIG. 13). It may be said that seed fragment 54c corresponds to, for example, node n4 of FIG. 11A (node n4 is not corrected to, for example, node n5 by an edge). Accordingly, the process proceeds to step 22 to select a new seed fragment.

As mentioned above, any fragment can be selected as a seed fragment. Following the exemplary rule of choosing a corner fragment as a seed fragment, fragment 54d becomes a seed fragment, as shown in FIG. 14. The process proceeds to step S24 to find a fragment with a misprinted edge opposing to seed fragment 54d. Fragment 54e can be an opposing fragment. The process analyzes the graph regarding fragments 54d and 54e to determine if the topological condition is met (step S26). Because seed fragment 54d and opposing fragment 54e are considered to have a graph as shown in FIG. 10A, opposing fragment 54e can, therefore, be separated from polygon 50. The process, then, moves fragment 54e to the second mask pattern as shown in FIG. 15 and save the modified first mask pattern (i.e., having fragment 54e removed) and the modified second pattern (i.e., having fragment 54e added) in steps S28 and S30.

Figure 17:
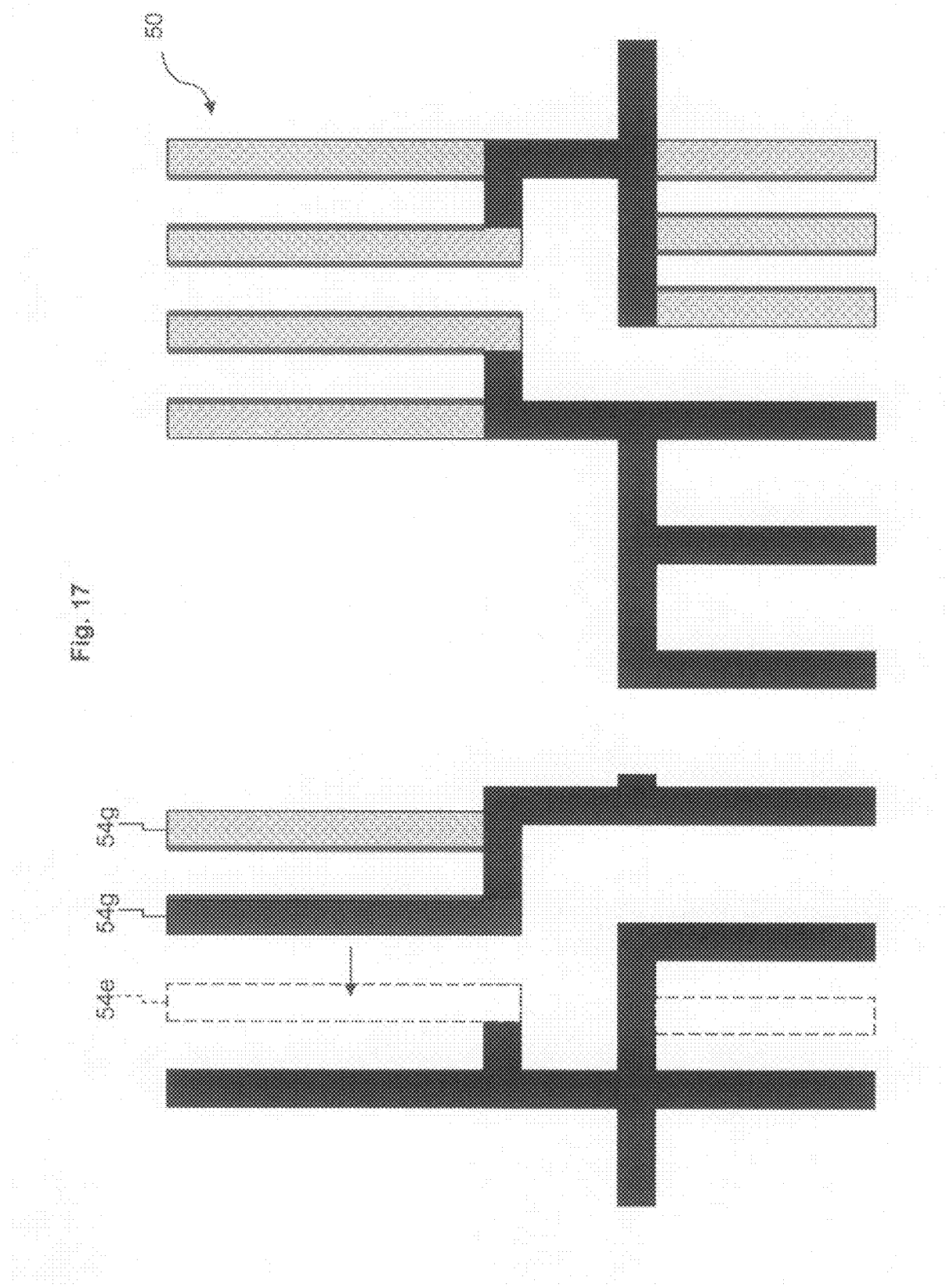
FIG. 17 is an exemplary diagram illustrating selection of a seed fragment with a misprinted edge and an opposing fragment with a misprinted edge in accordance with an embodiment of the present invention.
Figure 18:
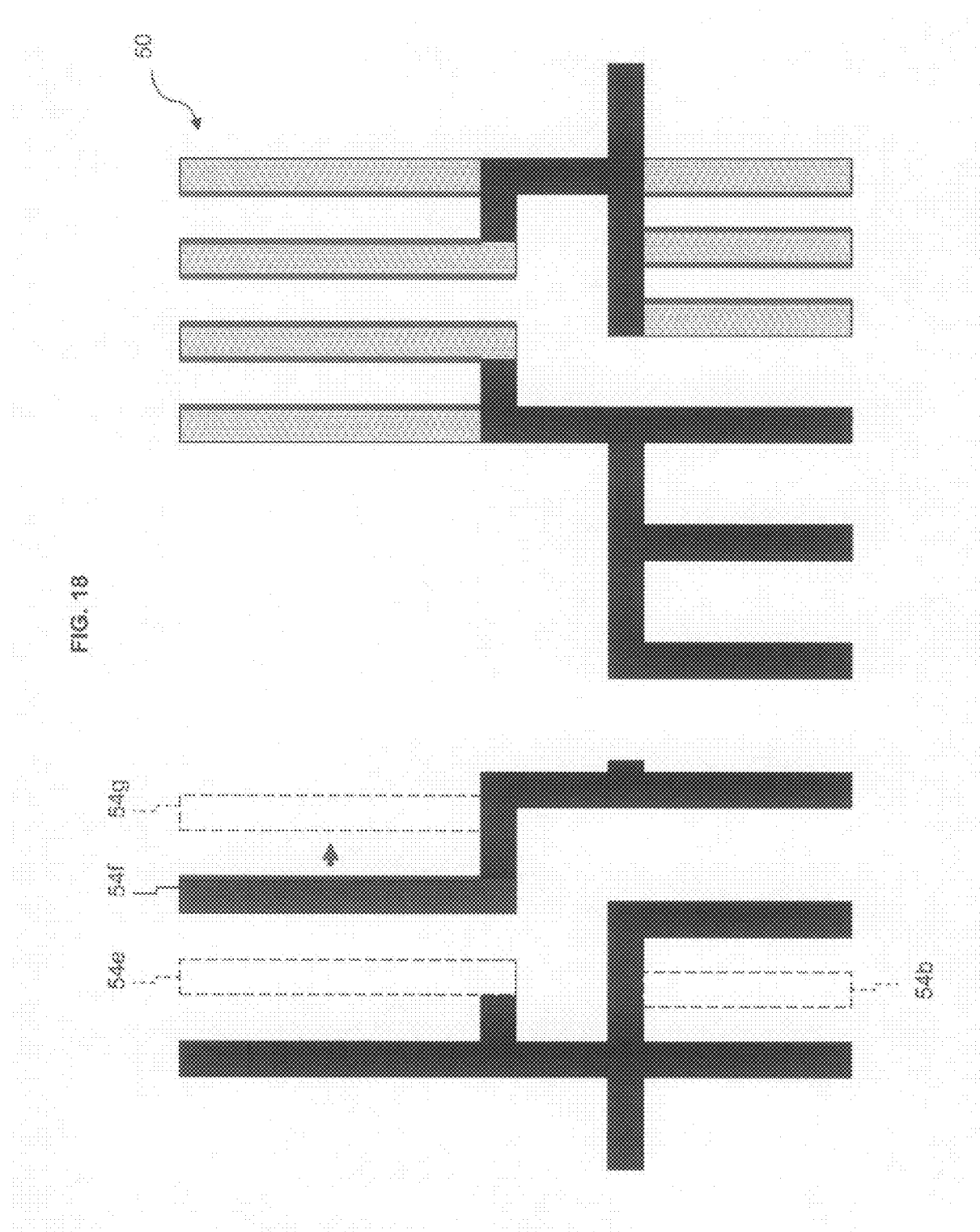
FIG. 18 is an exemplary diagram illustrating separation of the opposing fragment from a polygon in accordance with an embodiment of the present invention.

FIG. 16 shows the circuit pattern after the ILS-based pre-split fragmentation in step S16 in the third loop. In step S20, the process determines whether there was a fragment having a misprinted edge opposing to fragment 54e which moved to the second mask pattern in the second loop. As shown in FIG. 17, the process finds fragment 54f which was the fragment having the misprinted edge opposing to fragment 54e in the previous loop (step S20). The process, thus, proceeds to step S32 to run the "seed opposed to polygon in the second mask" procedure, in which fragment 54f is selected as a seed fragment. Then, the process proceeds to step S34 to determine whether there is a fragment with a misprinted edge opposing seed fragment 54f. The process finds fragment 54g to oppose the misprinted edge of seed fragment 54f. Since the graph obtained in step S16 for fragments 54f and 54g is considered to be the graph shown in FIG. 10A (step S26), opposing fragment 54g can be moved to the second mask pattern, as shown in FIG. 18 (step S28).

Figure 19:
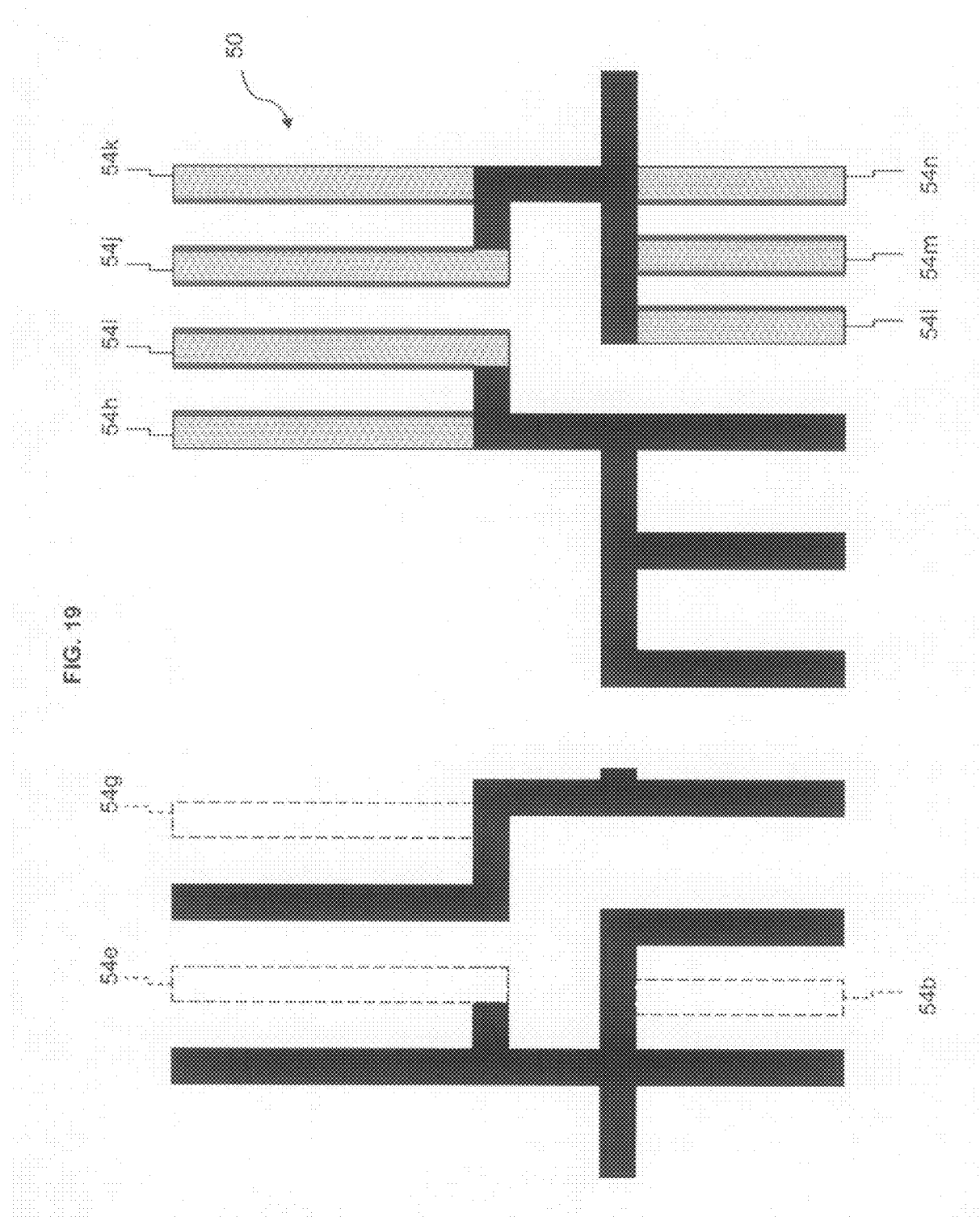
FIG. 19 is an exemplary diagram illustrating a circuit pattern after the ILS-based pre-split fragmentation is performed in accordance with an embodiment of the present invention.

FIG. 19 shows the circuit pattern after the ILS-based pre-split fragmentation in step S16 in the fourth loop. The fragmentation step is performed after moving fragment 54g to the second mask pattern. Because there was no fragment having a misprinted edge opposing to fragment 54g which moved to the second mask in the previous loop (step S20), the process goes to step S22 to run the "new single seed" procedure (see FIG. 11A: end of the tree of graphs). In step S22, fragment 54h having a misprinted edge is selected as a seed fragment (FIG. 20). The process finds fragment 54i having a misprinted edge opposing to seed fragment 54h (step S24), determines whether fragment 54i can be moved to the second mask (step S26), and then, moves the fragment to the second mask as shown in FIG. 21 (step S28).

Figure 23:
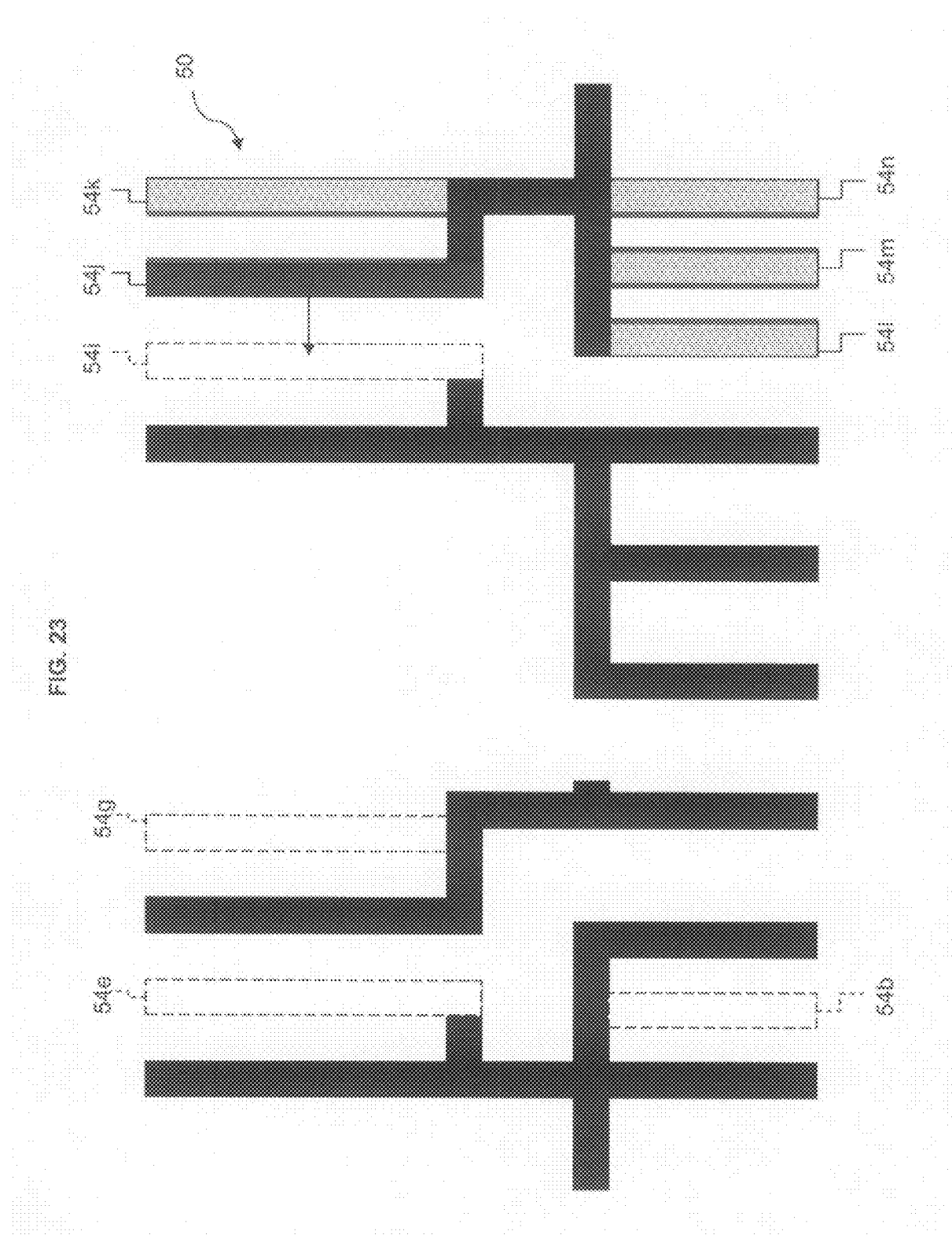
FIG. 23 is an exemplary diagram illustrating selection of a seed fragment with a misprinted edge and an opposing fragment with a misprinted edge in accordance with an embodiment of the present invention.

FIG. 22 shows the circuit pattern after the ILS-based pre-split fragmentation in step S16. The fragmentation step is performed after moving fragment 54i to the second mask. Because there was fragment 54j having a misprinted edge opposing to fragment 54i which moved to the second mask in the previous loop (step S20), the process goes to step S32 to run the "seed opposed to the second mask" procedure. In step S32, fragment 54j having a misprinted edge is selected as a seed fragment (FIG. 23). The process also finds fragment 54k with a misprinted edge opposing to seed fragment 54j (step S24), determines whether fragment 54k can be moved to the second mask (step S26), and then, moves the fragment to the second mask as shown in FIG. 24 (step S28).

Figure 26:
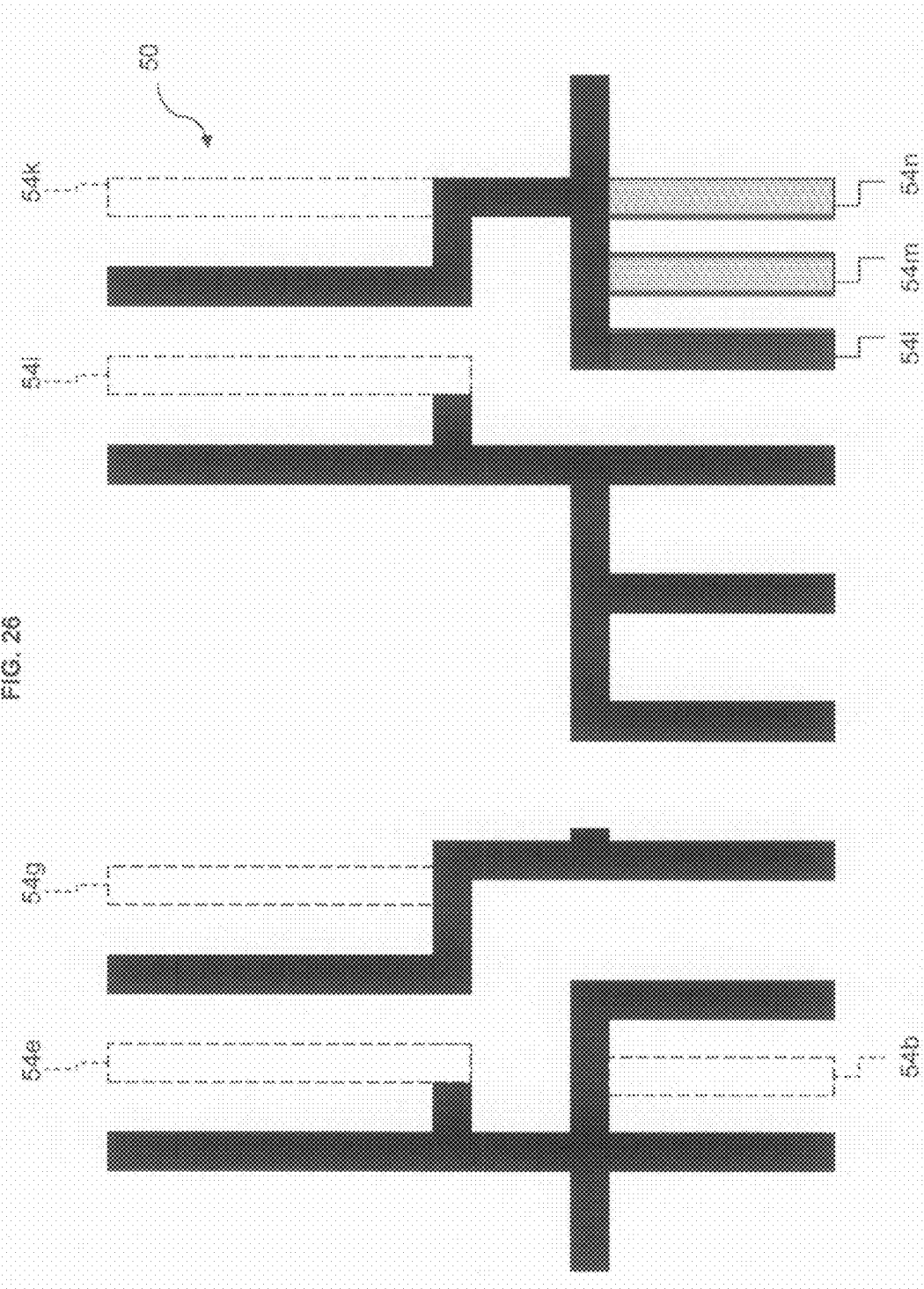
FIG. 26 is an exemplary diagram illustrating selection of a seed fragment with a misprinted edge and an opposing fragment with a misprinted edge in accordance with an embodiment of the present invention.

FIG. 25 shows the circuit pattern after the ILS-based pre-split fragmentation in step S16. The fragmentation step is performed after moving fragment 54k to the second mask. Because there was no fragment having a misprinted edge opposing to fragment 54k which moved to the second mask in the previous loop (step S20), the process goes to step S22 to run the "new single seed" procedure. In step S22, fragment 54l having a misprinted edge is selected as a seed fragment (FIG. 26). The process also finds fragment 54m with a misprinted edge opposing to seed fragment 54l (step S24), determines whether fragment 54m can be moved to the second mask (step S26), and then, moves the fragment to the second mask as shown in FIG. 27 (step S28).

Figure 28:
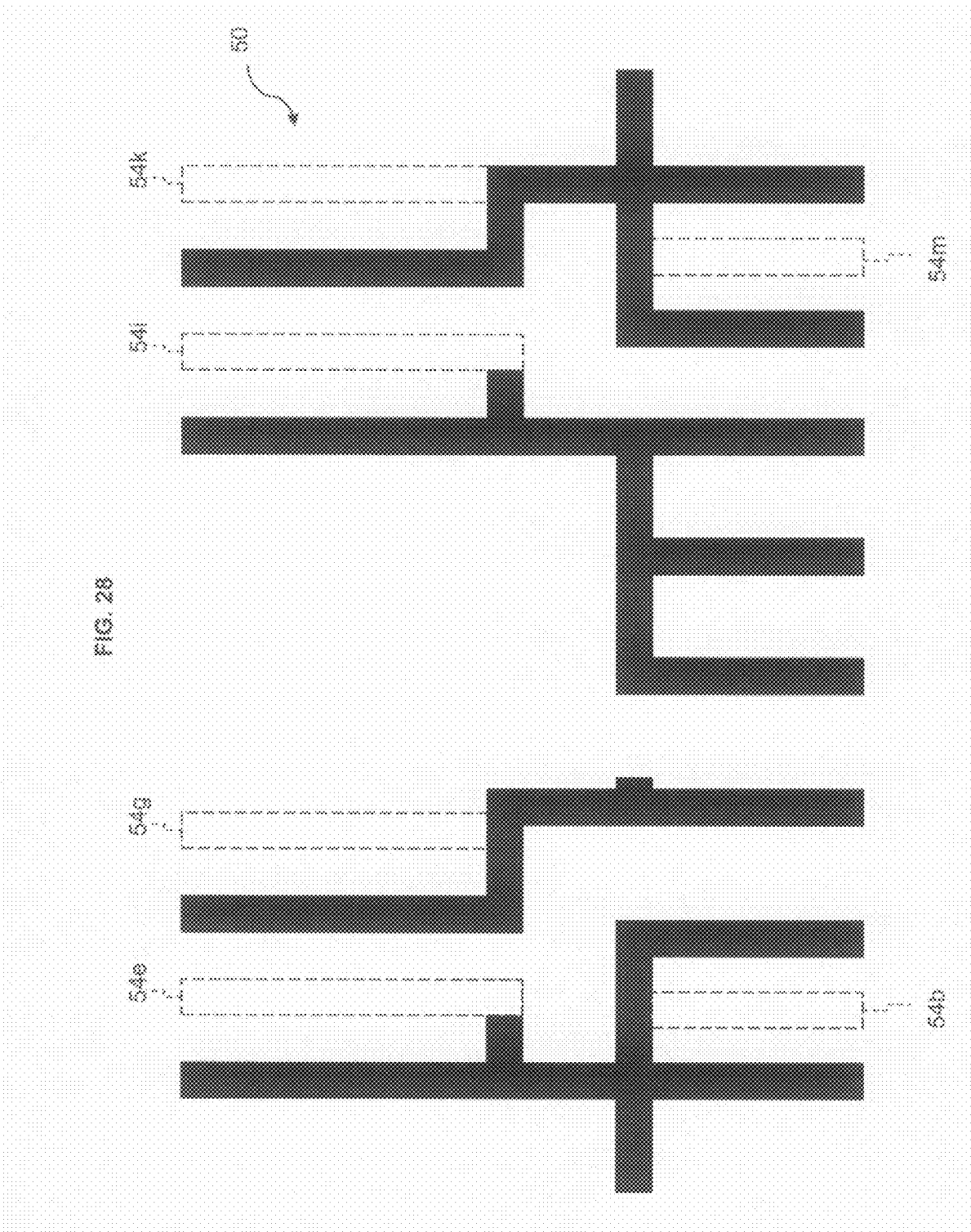
FIG. 28 is an exemplary diagram illustrating a circuit pattern after the ILS-based pre-split fragmentation is performed in accordance with an embodiment of the present invention.
Figure 29:
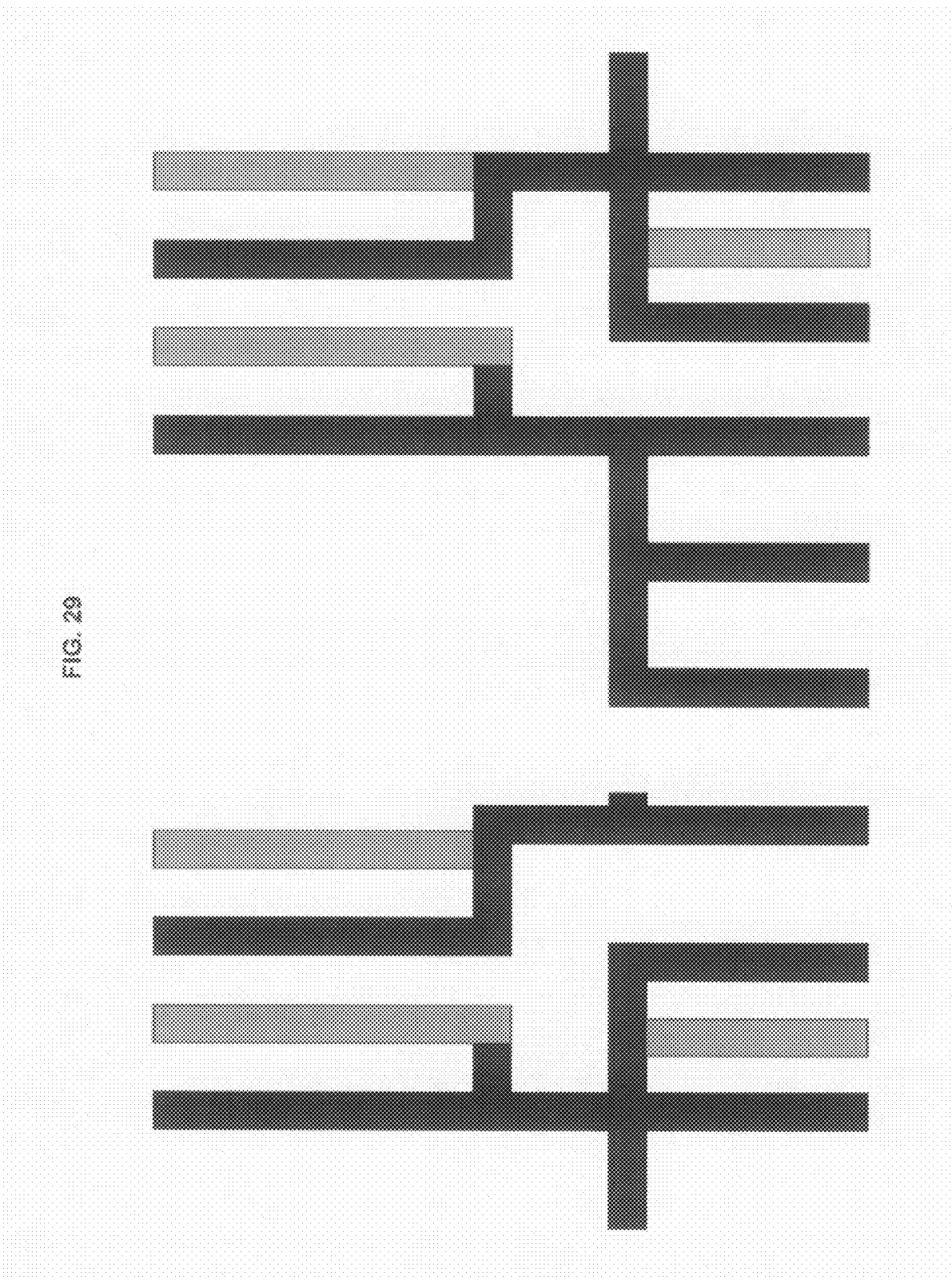
FIG. 29 is an exemplary diagram illustrating polygons split into the two circuit patterns in accordance with an embodiment of the present invention.

After moving fragment 54m to the second mask pattern, the process performs steps S12 and S14 and determines that there is no misprinted edge in the circuit pattern, as shown in FIG. 28. The process is, therefore, terminated. FIG. 29 shows the final result of splitting an original circuit pattern into two circuit patterns. Hatched polygons are assigned to the second mask and the other polygons are assigned to the first mask. The OPC may be performed on the two circuit patterns, and these two masks will be used for the double-patterning process.

According to the embodiment described above, the disclosure can provide where and how a circuit pattern can be separated and algorithms of separating a circuit pattern into multiple circuit patterns. The disclosed embodiment allows for the automated design of two masks (for example) for a given target pattern to be utilized in a double patterning process. As such, the method disclosed is time efficient and minimizes the need for experienced design engineers for the mask design process.

A robust and process modeling based splittability check allows to find unsplittable configuration at an early stage of design development and helps a designer to fix them because a simulation shows all critical spaces and pitches basing on the real process resolution.

A model based split allows error-free design decomposition. Decision to split is done according to the real process resolution. Accordingly, an unnecessary split is impossible and no unsplit features are expected. Even unpredicted configuration of polygons can be split based on the process simulation. Although rule based split methods suffer from complicated and unpredicted designs, the proposed model based pitch decomposition does not have such a problem. The model based split also allows finding and fixing "critical pitches"—pitches larger than minimal with reduced process windows.

Figure 30:
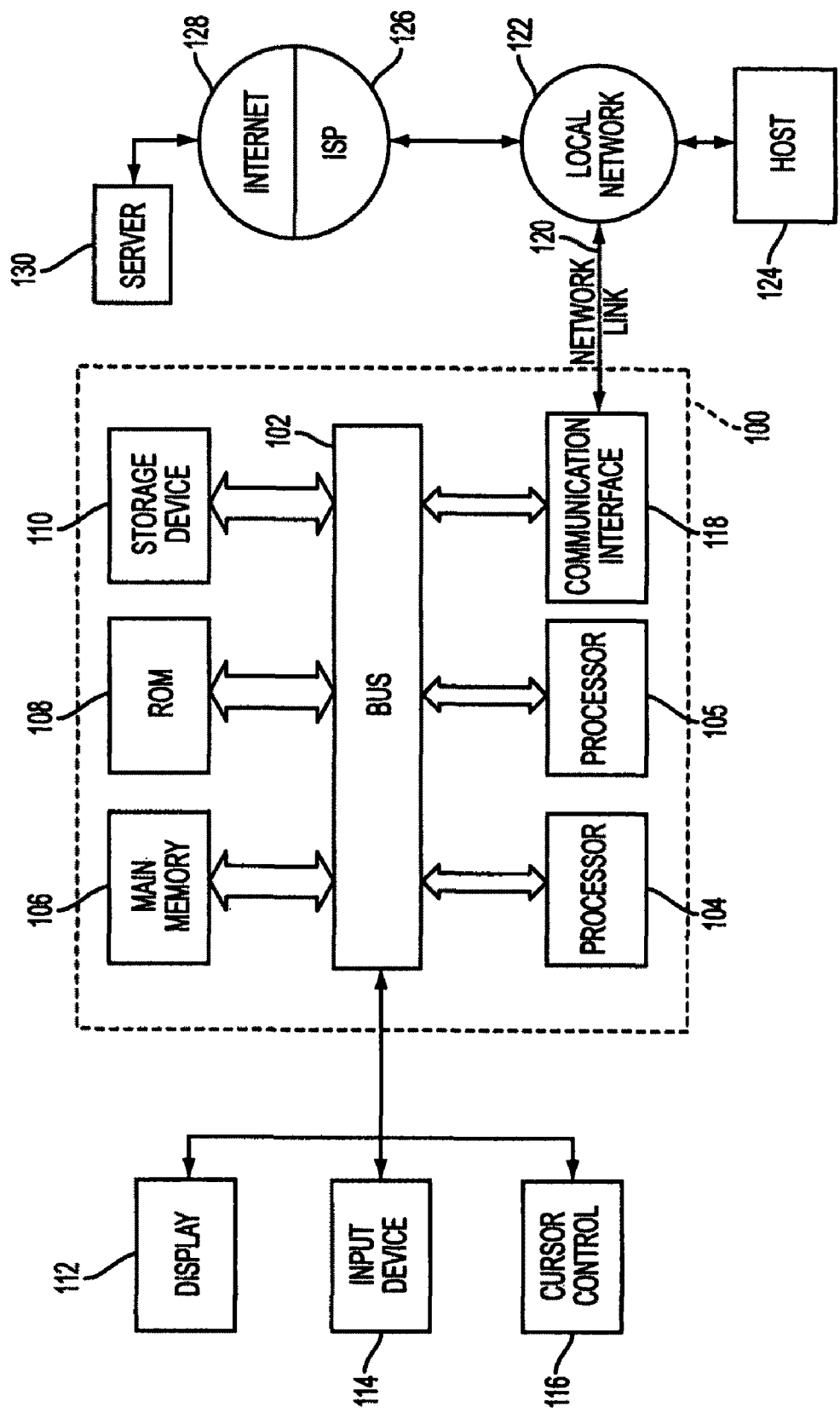
FIG. 30 is an exemplary block diagram illustrating a computer system which can implement a process of obtaining optimized short-range flare model parameters according to an embodiment of the present invention.

FIG. 30 is a block diagram that illustrates a computer system 100 which can implement the disclosed process explained above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the disclosed process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the disclosed process of the embodiment, for example. The received code may be executed by processor 104 as it is received, and/or stored in storage device 110, or other non-volatile storage for later execution. In this manner, computer system 100 may obtain application code in the form of a carrier wave.

Figure 31:
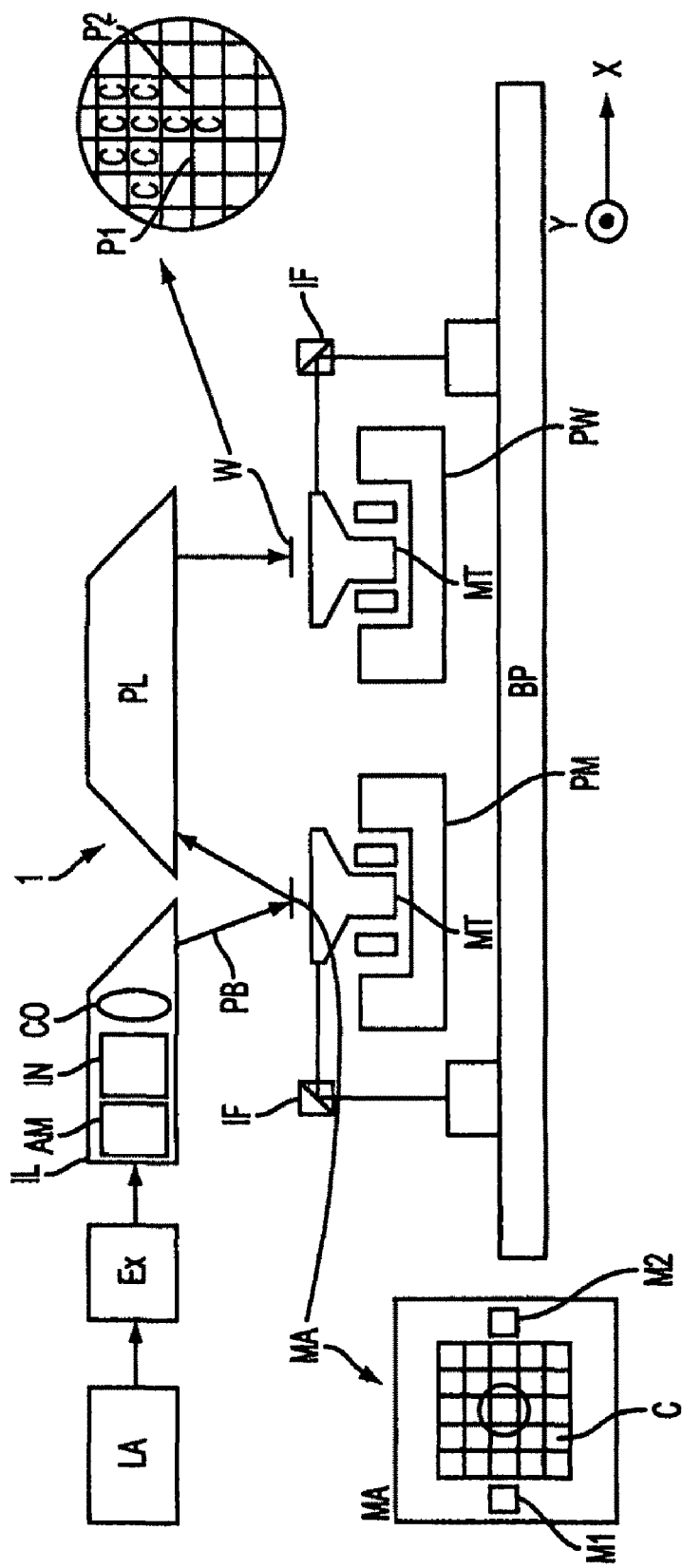
FIG. 31 schematically depicts an exemplary lithographic projection apparatus suitable for use with a mask designed with the aid of an embodiment of the present invention.

FIG. 31 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 31 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 31. However, in the case of a wafer stepper (as opposed to a step-and-scan tool) the mask table MT may just be connected to a short-stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method for separating an original circuit pattern to be printed on a wafer via a lithography process, into multiple circuit patterns, comprising the steps of:
    obtaining circuit pattern data;
    identifying a model of the lithography process;
    performing a simulation of the lithography process using the model to obtain image quality information on edges of polygons in the circuit pattern based on the circuit pattern data;
    identifying edges that are expected to be printed properly and edges that are expected to be printed improperly on the wafer according to the image quality information obtained from the simulation; and
    separating the original circuit pattern into multiple circuit patterns such that each of the multiple patterns does not have any improperly printed edges.

2. The method according to claim 1, wherein the separating step includes:
    selecting a first polygon with a first improperly printed edge among the polygons, and finding at least one second polygon with a second not-properly printed edge opposing to the first improperly printed edge;
    determining whether the second polygon can be separated from the first polygon based on a topological criterion; and
    separating the second polygon from the first polygon when it is determined that the second polygon can be separated.

3. The method according to claim 2, wherein the performing step, the identifying step, and the separating step including the selecting, determining, and separating steps are executed in that order until no polygon with a improperly printed edge is found in the original circuit pattern.

4. The method according to claim 3, wherein the topological criterion at least causes the determining step to determine whether there are one first improperly printed edge and 2n second improperly printed edges (n: integer), and these edges are opposed to each other, and when the topological criterion is met, the separating step does not separate the second polygon from the first polygon.

5. The method according to claim 3, wherein the selecting step selects a third polygon with a third improperly y printed edge, the third improperly printed edge having been opposed to the separated second polygon, and finding a fourth polygon with a fourth improperly printed edge opposing to the third improperly printed edge of the third polygon,
    the determining step determines whether the fourth polygon can be separated from the third polygon based on the topological criterion, and the separating step separates the fourth polygon from the third polygon when it is determined that the fourth polygon can be separated.

6. The method according to claim 5, wherein the selecting step selects any of polygons with a not-printed edge as the first polygon when no third polygon exists.

7. The method according to claim 1, wherein the image quality information is one of an image log-slope (ILS) and a normalized image log-slope (NILS).

8. An apparatus for separating, using a computer processor, an original circuit pattern to be printed on a wafer via a lithography process, into multiple circuit patterns, comprising:
 a first unit in the computer processor configured for performing a simulation of the lithography process using a model of the lithography process to obtain image quality information on edges of polygons in the circuit pattern obtained from circuit pattern data;
 a second unit in the computer processor configured for identifying edges that are expected to be printed properly and edges that are expected to be printed improperly on the wafer according to the image quality information obtained from the simulation; and
 a third unit in the computer processor configured for separating the original circuit pattern into multiple circuit patterns such that each of the multiple patterns does not have any improperly printed edges.

9. The apparatus according to claim 8, wherein the third unit in the computer processor is further configured for selecting a first polygon with a first improperly printed edge among the polygons, and finding at least one second polygon with a second improperly printed edge opposing to the first improperly printed edge;
 determining whether the second polygon can be separated from the first polygon based on a topological criterion; and
 separating the second polygon from the first polygon when it is determined that the second polygon can be separated.

10. The apparatus according to claim 9, wherein the performing of the simulation, the identifying of the edges, the selecting of the first polygons, the finding of the second polygons, the determining whether the second polygon can be separated, and the separating of the second polygon are executed in that order until no polygon with a improperly printed edge is found in the original circuit pattern.

11. The apparatus according to claim 10, wherein the topological criterion at least causes the third unit in the computer processor to determine whether there are one first improperly printed edge and 2n second improperly printed edges (n: integer), and these edges are opposed to each other, and when the topological criterion is met, the third unit does not separate the second polygon from the first polygon.

12. The apparatus according to claim 10, wherein the third unit in the computer processor is further configured for
 selecting a third polygon with a third improperly printed edge, the third improperly printed edge having been opposed to the separated second polygon, and finding a fourth polygon with a fourth improperly printed edge opposing to the third improperly printed edge of the third polygon,
 determining whether the fourth polygon can be separated from the third polygon based on the topological criterion, and
 separating the fourth polygon from the third polygon when it is determined that the fourth polygon can be separated.

13. The apparatus according to claim 12, wherein the third unit in the computer processor selects any of polygons with a not-printed edge as the first polygon when no third polygon exists.

14. The apparatus according to claim 8, wherein the image quality information is one of an image log-slope (ILS) and a normalized image log-slope (NILS).

15. A non-transitory computer readable storage medium storing a computer program for separating an original circuit pattern to be printed on a wafer via a lithography process, into multiple circuit patterns, when executed, causing a computer to perform the steps of:
 obtaining circuit pattern data;
 identifying a model of the lithography process;
 performing simulation of the lithography process using the model to obtain image quality information on edges of polygons in the circuit pattern based on the circuit pattern data;
 identifying edges that are expected to be printed properly and edges that are expected to be printed improperly on the wafer according to the image quality information obtained from the simulation; and
 separating the original circuit pattern into multiple circuit patterns such that each of the multiple patterns does not have any improperly printed edges.

16. The non-transitory computer readable storage medium according to claim 15, wherein the separating step includes:
 selecting a first polygon with a first improperly printed edge among the polygons, and finding at least one second polygon with a second improperly printed edge opposing to the first improperly printed edge;
 determining whether the second polygon can be separated from the first polygon based on a topological criterion; and
 separating the second polygon from the first polygon when it is determined that the second polygon can be separated.

17. The non-transitory computer readable storage medium according to claim 15, wherein the performing step, the identifying step, and the separating step including the selecting, determining, and separating steps are executed in that order until no polygon with a improperly printed edge is found in the original circuit pattern.

18. The non-transitory computer readable storage medium according to claim 17, wherein the topological criterion at least causes the determining step to determine whether there are one first improperly printed edge and 2n second improperly printed edges (n: integer), and these edges are opposed to each other, and
 when the topological criterion is met, the separating step does not separate the second polygon from the first polygon.

19. The non-transitory computer readable storage medium according to claim 17, wherein the selecting step selects a third polygon with a third improperly printed edge, the third improperly printed edge having been opposed to the separated second polygon, and finding a fourth polygon with a fourth improperly printed edge opposing to the third improperly printed edge of the third polygon,
 the determining step determines whether the fourth polygon can be separated from the third polygon based on the topological criterion, and
 the separating step separates the fourth polygon from the third polygon when it is determined that the fourth polygon can be separated.

20. The non-transitory computer readable storage medium according to claim 19, wherein the selecting step selects any of polygons with a not-printed edge as the first polygon when no third polygon exists.

21. The non-transitory computer readable storage medium according to claim 15, wherein the image quality information is one of an image log-slope (ILS) and a normalized image log-slope (NILS).

22. A device manufacturing method using a lithography process comprising the steps of:
   (a) providing a substrate that is at least partially covered by a layer of radiation-sensitive material;
   (b) providing a projection beam of radiation using an imaging system;
   (c) using patterns on masks to endow the projection beam with patterns in its cross-section;
   (d) projecting the patterned beam of radiation onto a target portion of the layer of radiation-sensitive material, wherein in step (c), providing a pattern on a mask includes the steps of:

performing a simulation of the lithography process using a model of the lithography process to obtain image quality information on edges of polygons in a circuit pattern obtained from circuit pattern data;

identifying edges that are expected to be printed properly and printed edges that are expected to be printed improperly on the wafer according to the image quality information obtained from the simulation; and separating the original circuit pattern into multiple circuit patterns to be assigned to the masks, respectively, such that each of the multiple patterns does not have any improperly printed edges.

* * * * *